United States Patent
Gerard et al.

(10) Patent No.: US 11,799,056 B2
(45) Date of Patent: Oct. 24, 2023

(54) SINGLE-PHOTON SOURCE WITH HIGH INDISCERNIBILITY FACTOR

(71) Applicant: Commissariat a l'Energie Atomique et aux Energies Alternatives, Paris (FR)

(72) Inventors: Jean-Michel Gerard, Grenoble (FR); Julien Claudon, Grenoble (FR)

(73) Assignee: Commissariat a l'Energie Atomique et aux Energies Alternatives, Paris (FR)

(*) Notice: Subject to any disclaimer, the term of this patent is extended or adjusted under 35 U.S.C. 154(b) by 776 days.

(21) Appl. No.: 16/924,304

(22) Filed: Jul. 9, 2020

(65) Prior Publication Data

US 2021/0013702 A1    Jan. 14, 2021

(30) Foreign Application Priority Data

Jul. 10, 2019  (FR) ..................................... 19 07759

(51) Int. Cl.
| | |
|---|---|
| *H01L 33/06* | (2010.01) |
| *H01L 33/20* | (2010.01) |
| *G02B 6/10* | (2006.01) |
| *G02B 6/122* | (2006.01) |
| *B82Y 20/00* | (2011.01) |

(52) U.S. Cl.
CPC ............. *H01L 33/06* (2013.01); *H01L 33/20* (2013.01); *B82Y 20/00* (2013.01); *G02B 6/107* (2013.01); *G02B 6/1228* (2013.01)

(58) Field of Classification Search
CPC ......... H01L 33/06; H01L 33/20; B82Y 20/00; G02B 6/107; G02B 6/1228
See application file for complete search history.

(56) References Cited

U.S. PATENT DOCUMENTS

| | | | | |
|---|---|---|---|---|
| 2001/0016095 | A1* | 8/2001 | Tomita ................. | G02B 6/1225 385/39 |
| 2002/0196827 | A1* | 12/2002 | Shields .................... | H01S 5/10 257/14 |
| 2004/0149982 | A1* | 8/2004 | Michler ................ | H01S 5/1833 257/14 |
| 2005/0089292 | A1* | 4/2005 | Kinoshita ............ | G02B 6/1225 385/36 |
| 2006/0097389 | A1* | 5/2006 | Islam .................... | B82Y 10/00 257/734 |
| 2006/0280414 | A1 | 12/2006 | Beausoleil et al. | |

(Continued)

OTHER PUBLICATIONS

French Preliminary Search Report dated Apr. 3, 2020 in French Application 19 07759 filed on Jul. 10, 2019 (with English Translation of Categories of Cited Documents & Written Opinion), 12 pages.

(Continued)

*Primary Examiner* — Sean M Luck
(74) *Attorney, Agent, or Firm* — Oblon, McClelland, Maier & Neustadt, L.L.P.

(57) ABSTRACT

A single-photon source including a monomode photonic wire wherein a single-photon emitter is located, the photonic wire being formed of two coaxial parts that are distinct and spaced from one another along the longitudinal axis, including a lower part resting in contact with a support substrate and including the single-photon emitter.

14 Claims, 11 Drawing Sheets

(56) References Cited

U.S. PATENT DOCUMENTS

2012/0161663 A1\* 6/2012 Gregersen ............... H01L 33/06
                                                    315/246
2013/0056704 A1\* 3/2013 Shalaev ................ H04B 10/70
                                                    977/950

OTHER PUBLICATIONS

Gerard et al., "Very Efficient Single-Photon Sources Based on Quantum Dots in Photonic Wires", 2014 IEEE International Semiconductor Laser Conference, Sep. 7, 2014, 2 pages.
Dreeßen et al. "Suppressing phonon decoherence of high performance single-photon sources in nanophotonic waveguides", arxiv.org, Jun. 15, 2018, 17 pages.
Mermillod et al., "Harvesting, coupling and control of single exciton coherences in photonic waveguide antennas", arxiv.org, Apr. 8, 2016, 7 pages.

\* cited by examiner

SINGLE-PHOTON SOURCE WITH HIGH INDISCERNIBILITY FACTOR

TECHNICAL FIELD

The field of the invention is that of single-photon sources having a photonic wire containing a single-photon emitter for which it is sought to improve the indiscernibility factor. The invention is applicable in particular in the fields of cryptography, quantum communications, photonic quantum computing and metrology.

PRIOR ART

There are single-photon sources whose fields of application are for example in cryptography, quantum communications, photonic quantum computing and metrology. Generally speaking, a single-photon source is a light source capable of emitting, on demand, light pulses each containing a single photon. It is sought for the emitted photons to have the same state in terms of frequency, polarization and wave packet form.

Single-photon sources are characterized by several merit factors, including the purity factor P, which characterizes the absence of an emitted pulse containing more than 1 photon, the efficiency factor E, which expresses the probability of the emitted pulse effectively containing a single photon, and the indiscernibility factor I, which provides a measure of the "similarity" between two photons emitted in separate pulses.

A single-photon source comprises a single-photon emitter, which then forms an artificial atom, that is to say a system having two distinct energy levels, specifically a fundamental state |g⟩ and an excited state |e⟩. This may be, inter alia, a semiconductor quantum dot or else a colour centre of a diamond crystal. When the artificial atom is optically or electrically excited, it changes back from the first excited state |e⟩ to the fundamental state |g⟩ while emitting a single photon whose wavelength corresponds to the energy difference between these two states. This is the phenomenon of spontaneous emission. The single-photon source may in particular have two different configurations, depending on whether the single-photon emitter is arranged in a resonant optical microcavity or in a photonic nanowire forming a monomode waveguide.

FIG. 1A illustrates one example of a single-photon source 1A in a first configuration, in which a semiconductor quantum dot 23 is located in a pillar 2 forming a resonant optical microcavity. The pillar 2 rests on a support substrate 10 and is oriented along a longitudinal axis Δ orthogonal to the XY plane of the support substrate 10. The pillar 2 comprises a semiconductor quantum dot 23 made from InAs and placed in a layer made of GaAs, the latter being located between two Bragg reflectors 3.1, 3.2 made from GaAs/AlAs. The local diameter of the pillar 2 remains substantially constant along the longitudinal axis Δ, and is the order of a micron, for example equal to around 1 μm. This resonant microcavity 2 has discrete resonant modes, and the semiconductor quantum dot 23 has a band gap energy that preferably corresponds to the fundamental mode of the resonant microcavity 2, such that the emission of the semiconductor quantum dot 23 is accelerated greatly by the Purcell effect. Therefore, the probability of injecting a photon in the fundamental mode of the resonant microcavity 2 is close to 1. However, such single-photon sources 1A do not at present make it possible to achieve both a high efficiency factor E and a high indiscernibility factor I.

FIG. 1B illustrates one example of a single-photon source 1B in a second configuration, in which a semiconductor quantum dot 23 is located in a photonic wire 20 forming a monomode waveguide. The photonic wire 20 rests on a support substrate 10 that contains a reflective layer 12 covered with a dielectric layer 13. The photonic wire 20 supports only one optical mode in its narrowest cross section, and has a longitudinal variation in its local diameter, so as to form a mode adapter for optimizing light extraction out of the photonic wire 20 with a Gaussian emission pattern having a small numerical aperture. In this example, the photonic wire 20 has a flared general shape, but a tapered shape is also possible. Such a photonic wire 20 is described in particular in the article by Munsch et al. entitled *Dielectric GaAs antenna ensuring an efficient broadband coupling an InAs quantum-dot light emitter and a gaussian optical beam*, Phys. Rev. Lett. 110, 177402 (2013). In this example, the photonic wire 20 is made from a high-index crystalline material and comprises a semiconductor quantum dot 23 made of InAs. Such a single-photon source 1B makes it possible to achieve a particularly high efficiency factor E, greater than 0.75, and possibly around 0.92 (Munsch 2013).

However, there is a need to have a single-photon source having a high indiscernibility factor I while at the same time keeping an efficiency factor E that is also high. However, it appears that the properties of the emitter may be impacted by mechanical vibrations of the photonic wire, thereby possibly leading to degradation of the indiscernibility factor I of the single-photon source (cf. in particular the article by Yeo et al. entitled *Strain-mediated coupling in a quantum dot-mechanical oscillator hybrid system*, Nat. Nanotechnol. 9, 106-110, 2014).

DISCLOSURE OF THE INVENTION

The aim of the invention is to at least partly overcome the drawbacks of the prior art, and more particularly to propose a single-photon source with a photonic wire forming a monomode waveguide whose indiscernibility factor I is improved.

To this end, the subject of the invention is a single-photon source comprising:
  a support substrate comprising a reflective layer; and
  a photonic wire:
    resting on the support substrate and arranged facing the reflective layer, and extending along a longitudinal axis Δ substantially orthogonal to the plane of the support substrate,
    comprising a single-photon emitter,
    forming a monomode waveguide for the single photons, and
    having transverse dimensions that vary longitudinally in the direction of an upper end of the photonic wire, so as to form a mode adapter for a guided optical mode.

According to the invention, the photonic wire is formed of two coaxial parts that are distinct and spaced from one another along the longitudinal axis Δ, specifically: a lower part, resting in contact with the support substrate, in which the emitter is arranged; and an upper part, suspended above the lower part and optically coupled thereto.

In addition, the single-photon source comprises a holding structure comprising: at least one pillar resting in contact with the support substrate and arranged adjacent to the photonic wire; and at least one holding arm mechanically connecting the upper part to the pillar and keeping the upper part suspended above the lower part.

Some preferred but non-limiting aspects of this single-photon source areas follows.

Preferably, the lower part has a volume less than that of the upper part.

Preferably, the upper part comprises the mode adapter.

Preferably, the upper part is spaced from the lower part by a distance $d_{sp}$ of between nm and $\lambda_e/n$, where $\lambda_e$ is the wavelength of the photons emitted by the emitter and where n is the refractive index of the crystalline material of the photonic wire.

The photonic wire and the pillar may be based on one and the same crystalline material.

The pillar may comprise a spacer portion made of a sacrificial material, arranged between two parts of the pillar that are made from the crystalline material, this spacer portion being coplanar with the spacing between the lower and upper parts of the photonic wire.

The holding arm may be made from said same crystalline material, and may extend in a plane parallel to the plane of the support substrate from a lateral edge of the upper part.

The holding arm may be made from a material different from said crystalline material, and may extend over and in contact with an upper end, opposite the support substrate, of the photonic wire.

The photonic wire may have a flared shape or a tapered shape in a direction opposite the support substrate.

The photonic wire may have a tapered shape, and the holding arm may comprise a holding portion partly in contact with the upper part, the holding portion having rotational symmetry about the longitudinal axis $\Delta$ and an average dimension in a plane parallel to the support substrate greater than a maximum value of the transverse dimensions of the photonic wire.

The photonic wire may be based on a crystalline material chosen from among III-V compounds or II-VI compounds, and the emitter may be formed of at least one semiconductor quantum dot.

The invention also relates to a method for manufacturing a single-photon source according to any one of the preceding features, comprising the following steps:
  producing a stack comprising: a support substrate comprising a reflective layer covered with an etch stop dielectric layer; a first and a second sub-layer that are intended to form the lower part, resting in contact with the dielectric layer, made from what is called a high-index crystalline material, and between which an emitter is located; a sacrificial layer resting in contact with the second sub-layer; a second layer intended to form the upper part, resting in contact with the sacrificial layer;
  partially etching the stack so as to form the pillar and the photonic wire, a portion of the sacrificial layer then contributing to defining a lateral edge of the pillar, and a portion of the sacrificial layer then contributing to defining a lateral edge of the photonic wire;
  selectively etching the sacrificial layer so as to eliminate the portion of the sacrificial layer of the photonic wire, and thus suspending the upper part above the lower part, while at the same time keeping at least part of the portion of the sacrificial layer of the pillar.

The holding arm may be produced in the step of forming the pillar and the photonic wire, such that it creates the mechanical connection between the pillar and the upper part of the photonic wire.

Following the step of forming the pillar and the photonic wire, the upper part might not be mechanically linked to the pillar. The method may then comprise the following steps:
  depositing an encapsulation layer covering the pillar and the photonic wire, and planarizing the encapsulation layer so as to free an upper end of the pillar and an upper end of the photonic wire;
  producing a holding arm extending over the encapsulation layer and in contact with the upper end of the pillar and the upper end of the photonic wire;
  eliminating the encapsulation layer;
  selectively etching the sacrificial layer, thus suspending the upper part above the lower part.

BRIEF DESCRIPTION OF THE DRAWINGS

Other aspects, aims, advantages and features of the invention will become more clearly apparent on reading the following detailed description of preferred embodiments thereof, this description being given by way of non-limiting example and with reference to the appended drawings, in which.

DETAILED DISCLOSURE OF PARTICULAR EMBODIMENTS

Figure 1A:
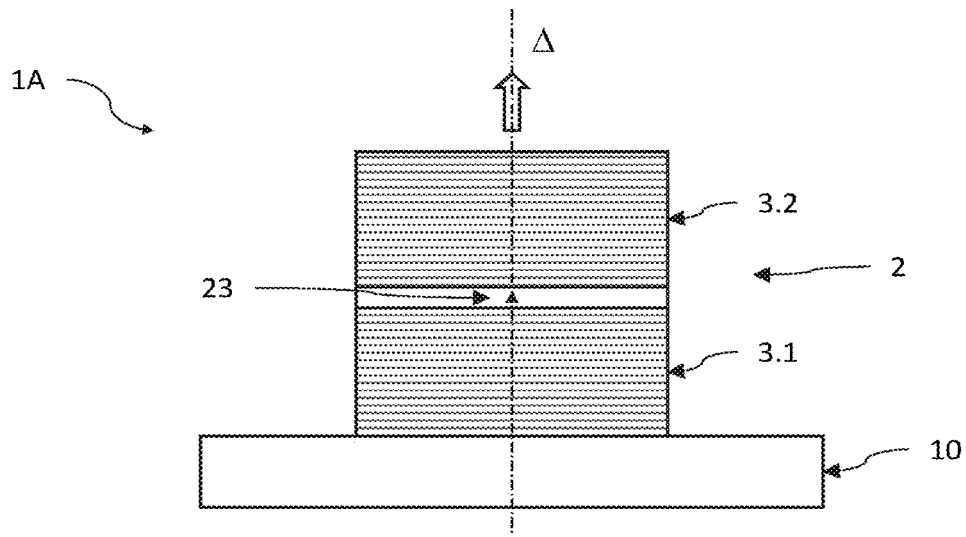
FIGS. 1A and 1B, already described, are schematic and partial longitudinal sectional views of two single-photon sources according to examples from the prior art, comprising a resonant microcavity (FIG. 1A) or a monomode photonic wire (FIG. 1B)

In the figures and in the remainder of the description, the same references represent identical or similar elements. In addition, the various elements are not shown to scale so as to improve the clarity of the figures. Moreover, the various embodiments and variants are not mutually exclusive and may be combined with one another. Unless indicated otherwise, the terms "substantially", "around", "of" the order of mean to within 10%, and preferably to within 5%. Moreover, the terms "between . . . and . . . " and the like mean that the bounds are included, unless indicated otherwise. The use of the indefinite article "a" or "an" for an element or a step does not rule out the presence of a plurality of such elements or steps, unless indicated otherwise.

The invention relates to a single-photon source for emitting photons with a high indiscernibility factor I. The photon source comprises a photonic wire forming a monomode waveguide of the type described above with reference to FIG. 1B, within which there is located a single-photon emitter forming an artificial atom.

A single-photon source is a source that produces, on demand, through spontaneous emission, light pulses containing only a single photon. Two photons are said to be indiscernible when they are identical in terms of quantum state, that is to say in terms of polarization, frequency and spatial and temporal distribution of the light pulse containing the single photon.

The single-photon emitter is similar, as a first approximation, to a two-level system. As mentioned above, such an emitter thus has a fundamental state |g⟩ and an excited state |e⟩. When it is brought into its excited state by an optical or electrical pulse, it relaxes spontaneously to its fundamental state |g⟩ while emitting, through spontaneous emission, one and only one photon whose wavelength corresponds to the energy difference between the excited state |e⟩ and the fundamental state |g⟩. Such a single-photon emitter thus has discrete energy levels, and reference is then made to an artificial atom by analogy to the discrete electronic states of an atom. Such an emitter may be a semiconductor quantum dot in which the confinement of the charges in the three directions in space on a nanometric scale renders the energy levels discrete. As is known, such an emitter may also be chosen from among nanocrystals, molecules, or even colour centres of an insulating (for example diamond) or semiconductor crystalline solid.

In the remainder of the description, the single-photon emitter is a semiconductor quantum dot, formed of a nanometric island of a semiconductor compound, for example InAs, insulated in a high-index crystalline material, for example GaAs, which forms the photonic wire. Thus, at a low temperature (a few kelvins for example), a short laser pulse with respect to the radiating lifetime of the quantum dot makes it possible to change same from its fundamental state |g⟩ to its excited state |e⟩. The quantum dot is de-excited by emitting a single photon through spontaneous emission. The single-photon source, through successive excitation of the quantum dot, thus emits, through spontaneous emission, photons at various times that are spaced in time.

However, Yeo et al. 2014 and the article by Munsch et al. entitled *Resonant driving of a single photon emitter embedded in a mechanical oscillator*, Nat. Commun. 8, 76 (2017) have shown that the properties of such a quantum dot may be modified by its surroundings, and in particular by mechanical vibrations of the photonic wire. More precisely, a mechanical deformation of the photonic wire generates mechanical stresses within the quantum dot that fluctuate over time, and then lead to a modification over time of the properties of the quantum dot, and in particular of the energy difference between the fundamental state |g⟩ and the excited state |e⟩. As a result, over the course of two successive emissions of single photons, the emission frequency fluctuates, thereby giving rise to single-photon bursts that differ from one another. This influence of the mechanical vibrations of the photonic wire on the properties of the quantum dot therefore contributes to degrading the indiscernibility factor I.

Therefore, the single-photon source according to the various embodiments described below comprises a monomode photonic wire divided into two coaxial parts that are distinct and spaced from one another along the longitudinal axis Δ, so as to reduce the influence of the mechanical vibrations of the photonic wire on the properties of the emitter, thus improving the indiscernibility factor I of the single-photon source.

Figure 2A:
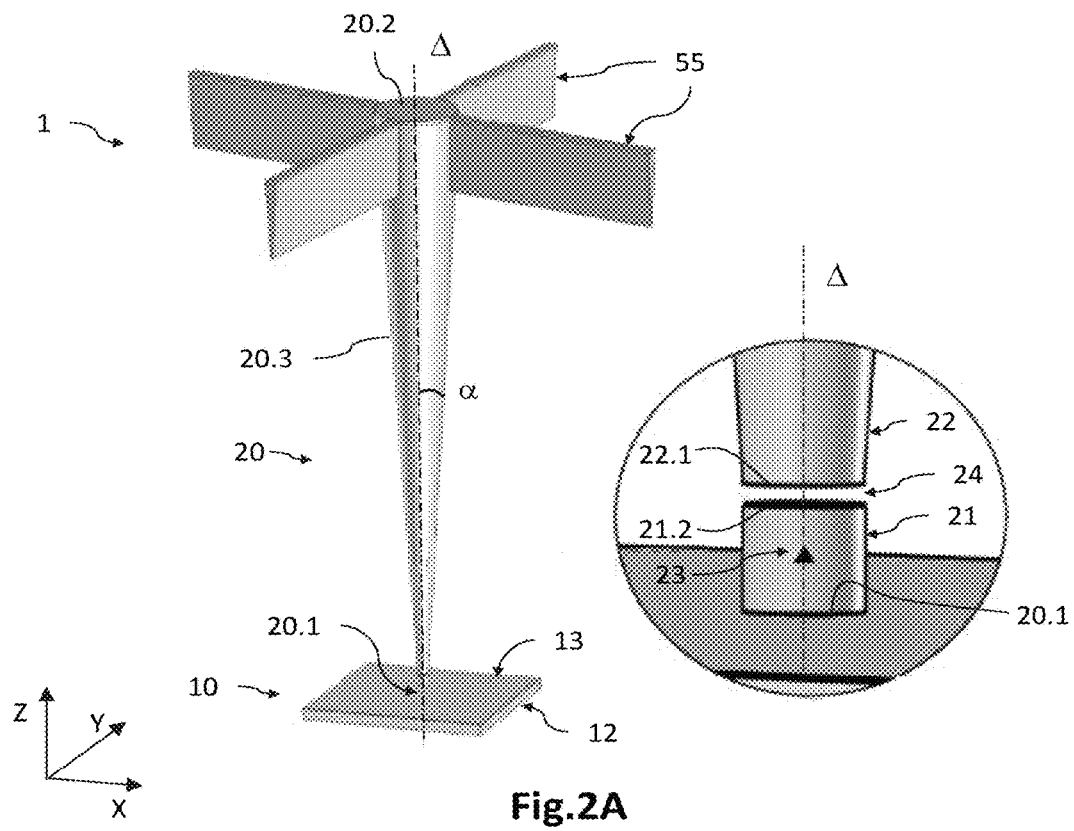
FIGS. 2A and 2B are schematic and partial perspective (FIG. 2A) and longitudinal sectional (FIG. 2B) views of a single-photon source according to a first embodiment in which the photonic wire has a flared general shape.
Figure 2B:
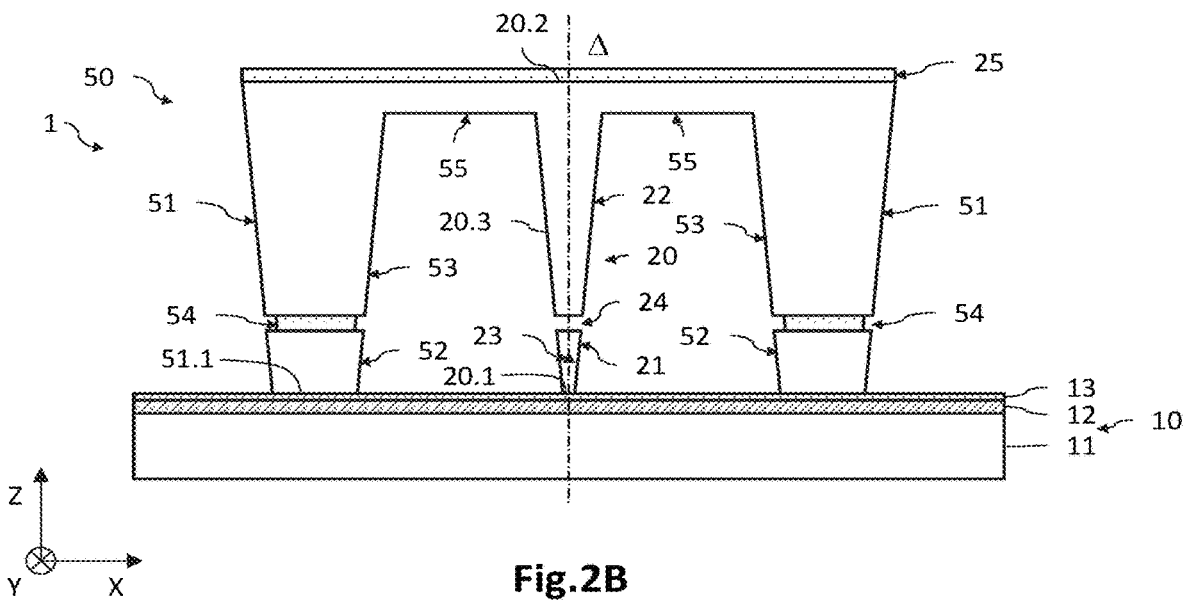

FIGS. 2A and 2B are schematic and partial perspective (FIG. 2A) and longitudinal sectional (FIG. 2B) views of a single-photon source 1 according to a first embodiment.

Generally speaking, the single-photon source 1 comprises at least one photonic wire that rests on a support substrate 10, a holding structure 50 for holding part of the photonic wire 20, an optical excitation device 30 designed to bring about the spontaneous emission of a single photon by the emitter 23, and a collection device 40 designed for example to create the optical coupling between the photonic wire 20 and an external waveguide 43.

In this first embodiment, the photonic wire 20 has a flared general shape in the direction of its upper end 20.2, that is to say that its local diameter increases moving away from the support substrate 10. The photonic wire 20 then forms a "photonic trumpet", according to the expression given in particular in the article by Munsch et al. 2013. Moreover, the single-photon emitter 23, in other words the artificial atom, is a quantum dot made from a semiconductor material and located in the high-index crystalline material on the basis of which the photonic wire 20 is formed.

An orthogonal three-dimensional direct coordinate system XYZ, in which the X-axis and Y-axis form a plane parallel to the main plane of the support substrate 10, and in which the Z-axis is oriented in the direction of the photonic wire 20 and is parallel to the longitudinal axis thereof, is defined here and for the remainder of the description.

Moreover, the terms "lower" and "upper" are understood to relate to an increasing position when moving away from the support substrate 10 in the direction +Z.

The support substrate 10 is the substrate on which the photonic wire 20 rests. It is formed of a thick, preferably rigid main layer 11 made from one or more materials. The main layer 11 may be a semiconductor wafer having for example a thickness of one to several hundred microns. It may be made here from doped or undoped GaAs.

A reflective layer 12 at least locally covers the main layer 11. It is located underneath the photonic wire 20 and is designed to reflect the photons emitted by the emitter 23 of the photonic wire 20. The reflective layer 12 may be made from a metal material, for example gold with a thickness of between for example 100 nm and 300 nm.

A dielectric layer 13 covers the reflective layer 12 and the main layer 11. It is made from a dielectric material with low absorbance at the emission wavelength, and also forms an etch stop layer against etching agents used in various chemical etching steps implemented by the method for manufacturing the single-photon source 1. The dielectric layer 13 may be made in particular from a silicon nitride, for example $Si_3N_4$ with a thickness of around 9 to 11 nm.

The photonic wire 20 rests on the support substrate 10 and is arranged facing, that is to say perpendicular to, the reflective layer 12. Generally speaking, the photonic wire 20 takes the form of an elongate three-dimensional element along a longitudinal axis Δ substantially orthogonal to the XY plane of the support substrate 10. In other words, it has a longitudinal dimension (height h) along the longitudinal axis Δ greater than the transverse dimensions. The transverse dimensions of the photonic wire 20, that is to say its dimensions in an XY plane, may for example be between 10 nm and 5 μm, and preferably between 100 nm and 2 μm. In so far as the transverse dimensions have a longitudinal variation along the longitudinal axis Δ, the height of the photonic wire 20 is greater than the maximum transverse dimensions, for example twice as great, preferably at least 5 times greater. The height h is defined as being the distance, along the Z-axis, between the lower end 20.1 of the photonic wire 20 in contact with the support substrate 10 and its upper end 20.2. The lower end 20.1 and the upper end 20.2 are connected to one another by a lateral edge 20.3.

The cross section of the photonic wire 20, in an XY plane orthogonal to the longitudinal axis Δ, may have various shapes, for example a circular, oval, polygonal, for example triangular, square, rectangular or even hexagonal shape depending in particular on whether or not it is desired for the guided mode to have polarization degeneracy, as described hereinafter. The diameter is defined here as being a size associated with the local perimeter of the photonic wire 20 for a cross section. This may be the diameter of a disc having the same surface area as the cross section of the photonic wire 20. The local diameter is the diameter of the photonic wire 20 for a cross section at a given height thereof. The average diameter is the average, for example arithmetic average, of the local diameters along the photonic wire 20 or a portion thereof. In this example, the photonic wire 20 has a circular cross section along the longitudinal axis Δ.

The photonic wire 20 is based on at least one high-refractive-index crystalline material. If the emitter 23 is a semiconductor quantum dot, the high-index crystalline material is chosen on the basis of the semiconductor compound of the quantum dot. The high-index crystalline material may thus be an III-V compound, for example GaAs or InP when the quantum dot is made from InAs, or AlN when the quantum dot is made from GaN. In this first embodiment, the photonic wire 20 is made from GaAs and comprises at least one quantum dot made of InAs. Other combinations of materials are possible, both from among III-V compounds and from among II-VI compounds, depending on the desired emission wavelength $\lambda_e$. As a variant, the emitter 23 may be a colour centre (single fault) of a diamond crystal (cf. in particular the article by Babinec et al. entitled *A diamond nanowire single-photon source*, Nat. Nanotechnol., 5, 195 (2010)).

The emitter 23 is in this case at least one quantum dot made from a semiconductor compound whose band gap energy determines the wavelength $\lambda_e$ of the emitted photons. The photonic wire 20 preferably comprises just a single quantum dot 23, preferably arranged on the longitudinal axis Δ of the photonic wire 20. This may thus be a quantum dot 23 made of InAs and arranged in a continuous what is called wetting layer made of InAs and that extends in a plane parallel to the XY plane. As a variant, the photonic wire 20 may comprise a plurality of quantum dots arranged in one and the same continuous wetting layer. The quantum dot 23 is preferably arranged at a height of around 100 nm with respect to the support substrate 10, where the local diameter of the photonic wire 20 is preferably equal to around 200 nm. If the emitter 23 is formed of a plurality of quantum dots, these might not have strictly identical dimensions, and may then emit photons at slightly different wavelengths. In this case, as described further on, the collection device 40 advantageously comprises a spectral filter 41 so as to transmit only the photons emitted by a chosen quantum dot.

The photonic wire 20 has transverse dimensions (local diameter) along the longitudinal axis Δ that are chosen so as to form a monomode waveguide at the emission wavelength $\lambda_e$, that is to say a waveguide supporting just one guided optical mode, for example the fundamental mode, in particular in the cross section of the photonic wire comprising the emitter.

To this end, the photonic wire 20 is based on a high-index crystalline material, in this case GaAs with a refractive index n equal to 3.45, which forms the core of the waveguide. It is surrounded by low-refractive-index surroundings that form the sleeve of the waveguide, for example a vacuum or a gas. In addition, in order to be monomode, the photonic wire 20 has a local diameter, in the cross section containing the emitter 23, substantially equal to $\lambda_e/n$. In the case of a quantum dot 23 made of InAs and designed to emit photons at a wavelength $\lambda_e$ of around 950 nm, the local diameter of the photonic wire at the quantum dot 23 is between around 150 nm and 300 nm, preferably equal to around 200 nm.

The shape of the cross section of the photonic wire 20 in the XY plane may be chosen such that the photonic wire 20 supports a polarization degeneracy or non-degeneracy fundamental mode. In this first embodiment, in which the photonic wire 20 has a circular cross section, it supports a polarization degeneracy fundamental mode (two linear and mutually orthogonal polarizations).

As a variant, the photonic wire 20 may have a cross section designed such that the emitted photons are polarized, as indicated in the article by Munsch et al. entitled *Linearly Polarized Single-Mode Spontaneous Emission in a Photonic Nanowire*, Phys. Rev. Lett, 108, 077405, 2012. To this end, the photonic wire 20 may have an elliptical cross section all along the longitudinal axis Δ. By way of example, in the plane of the quantum dot, the cross section may have a large axis of around 250 nm and a small axis of around 150 nm.

Moreover, the photonic wire 20 comprises a mode adapter for optimizing light extraction from the guided mode out of the photonic wire 20 and for obtaining a Gaussian emission pattern with a low numerical aperture. More precisely, the photonic wire 20 has a longitudinal variation in the local diameter in the direction of the upper end 20.2, so as to gradually de-confine the guided mode, thus making it possible to achieve a more directive far-field emission pattern that is thus suitable for effective coupling to an external waveguide 43. The local diameter thus changes, preferably monotonously, from a first extremum at its lower end 20.1 or from a given height to a second extremum, different from the first, at the upper end 20.2.

In this embodiment, the photonic wire 20 has a flared shape, in that the local diameter changes, in the direction +Z, from a minimum value $d_{min}$ to a maximum value $d_{max}$ located at the upper end 20.2. The longitudinal variation may be monotonous and linear. In this example, the photonic wire 20 has a flared general shape in that the minimum value $d_{min}$ is located at the lower end 20.1 and the local diameter increases monotonously and substantially linearly from $d_{min}$ to $d_{max}$. As a variant (not shown), the photonic wire 20 may have a flared shape over a given height only, and not over the entire length of the wire. Therefore, in this scenario, the local diameter first of all remains substantially constant and equal to $d_{min}$ over a non-zero height starting from the lower end 20.1, and then increases to the maximum value $d_{max}$ at the upper end 20.2.

As a variant, and as described in detail further on (cf. FIG. 6A-6B), the photonic wire may have a tapered shape in that the local diameter changes, in the direction +Z, from a maximum value $d_{max}$ to a minimum value $d_{min}$ located at the upper end 20.2. The longitudinal variation may be monotonous and linear. The photonic wire 20 may have a tapered shape over the entire height of the wire or over only part of the wire. In the latter case, in the direction +Z, the local diameter first of all remains substantially constant and equal to $d_{max}$ over a non-zero height, and then decreases as far as the upper end 20.2, which has a local diameter equal to $d_{min}$.

By way of example, in this embodiment in which the photonic wire 20 has a flared general shape, the photonic wire 20 may have a height of the order of around 12 µm, a maximum local diameter $d_{max}$ of around 1.5 µm at the upper end 20.2, the quantum dot 23 being located at a distance of around 100 nm from the support substrate 10 and the local diameter at the quantum dot 23 being around 200 nm. The local diameter has a monotonous and substantially linear longitudinal variation with a substantially constant angle of incline α of the lateral edge along the Z-axis, equal to around 3° to 5°.

Moreover, if the photonic wire 20 has a tapered shape (FIG. 6A-6B), the photonic wire 20 may have a height of the order of 10 m or even less, a minimum diameter $d_{min}$ of around 150 nm at the upper end 20.2, a monotonous and linear decrease in the local diameter along the direction −Z with an angle of incline of the order of around 1° to 2° over a height of around 1 µm, and then a substantially constant local diameter equal to around 200 nm as far as the lower end 20.1 of the photonic wire 20.

The single-photon source 1 comprises an optical excitation device 30 designed to bring about the spontaneous emission of photons by the quantum dot 23 in response to an excitation signal (laser pulse), and also comprises a collection device 40 designed to collect the signal (single photons) emitted by the emitter 23 in response to the excitation laser pulse and extracted from the photonic wire 20 in the direction +Z.

Figure 3A:
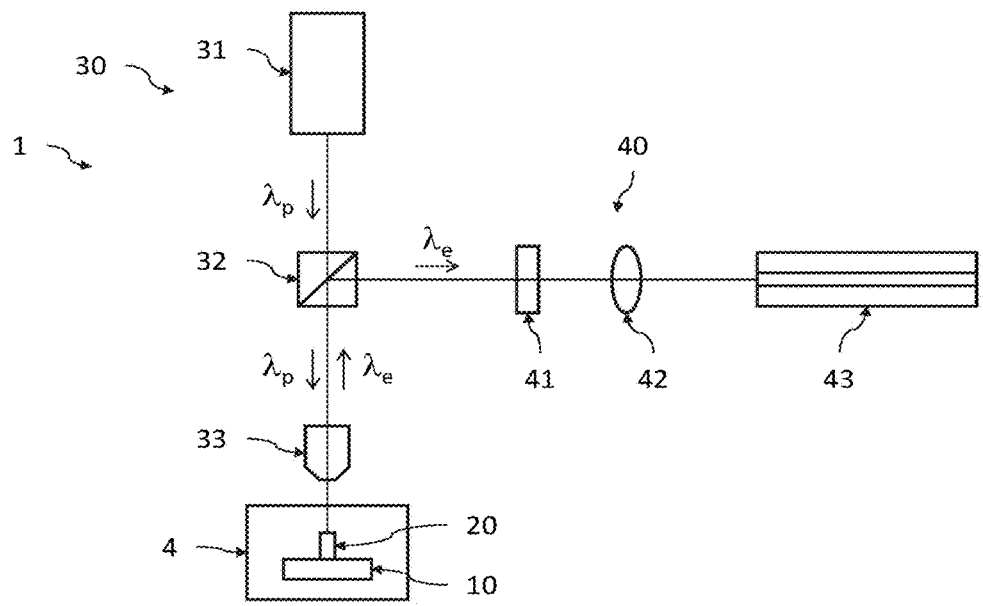
FIG. 3A is a schematic view of a single-photon source comprising an optical excitation device and a collection device according to a first variant.

FIG. 3A partially and schematically illustrates a variant of the optical excitation device 30 and of the collection device 40, for which the optical excitation path and the optical collection path are partly coincident.

The optical excitation device 30 comprises a laser source 31 designed to emit an excitation signal (laser pulse) at an excitation wavelength $\lambda_p$ (or pumping wavelength) less than or equal to the emission wavelength $\Delta_e$ of the quantum dot. The laser source 31 may be a titanium-sapphire laser whose wavelength $\lambda_p$ is for example equal to 820 nm. The repetition rate may be around 80 MHz or even more (a few GHz), and the typical width of the laser pulses may be of the order of a picosecond or even less.

In this example, the optical path of the laser pulses is defined by optics, not shown, such that the excitation signal is incident on the photonic wire 20 in a manner collinear with the longitudinal axis Δ. The excitation signal passes through a semi-reflective plate 32 and then a confocal microscope 33 that focuses the excitation signal on the photonic wire 20.

In order for the emitter to have a spectrally fine emission, the photonic wire 20 and the support substrate 10 are arranged in a cryostat 4 so as to bring the temperature to a value preferably below a few tens of kelvins.

The emitted photons are extracted out of the photonic wire 20 along the longitudinal axis Δ through the upper end, and oriented in the direction +Z, then transmitted by the confocal microscope 33, reflected by the semi-reflective plate 32, and are collected by the collection device 40, which creates optical coupling between the photonic wire 20 and in this case an external waveguide 43.

On the optical collection path, downstream of the semi-reflective plate 32, the collection device 40 advantageously comprises a spectral filter 41 if the photonic wire 20 comprises a plurality of quantum dots located in the same wetting layer. The spectral filter 41 may comprise a diffraction grating and have a resolution of 0.1 nm, for example. Thus, in so far as the quantum dots emit at various wavelengths (due to their different sizes and their different positions with respect to the longitudinal axis Δ in one and the same cross section), the spectral filter 41 makes it possible to select the light beam emitted by a particular quantum dot 23, preferably the one arranged closest to the longitudinal axis. Specifically, such a quantum dot 23 has a high spontaneous emission rate (SE rate), as indicated in particular in the article by Claudon et al. entitled *A highly efficient single-photon source based on a quantum dot in a photonic nanowire* Nat. Photonics, 4, 174 (2010).

The collection device 40 in this case comprises a lens 42 for focusing the signal emitted on the input of an external waveguide 43, for example an optical fibre. The optical fibre 43 may then be connected to a photodetector, for example an avalanche photodetector, or to any other optical and/or electronic device depending on the desired application for the single-photon source 1.

If the excitation signal (laser pulse) has the same wavelength as the signal (single photon) emitted by the photonic wire 20, in particular in the case of resonant optical pumping-based excitation, a polarizer (not shown) is arranged on the optical path of the emitted signal, for example between the semi-reflective plate 32 and the external waveguide 43. This thus makes it possible to separate the emitted signal from that part of the excitation signal diffused by the photonic wire 20. However, in this configuration, the probability of collecting the emitted photons may be reduced, thereby reducing the efficiency of the single-photon source 1.

It is therefore advantageous to completely dissociate the optical path of the excitation signal from the optical path of the signal emitted by the photonic wire 20. To this end, FIG. 3B partially and schematically illustrates another variant of the optical excitation device 30 and of the collection device 40, for which the optical excitation path and the optical collection path are completely dissociated.

Figure 3B:
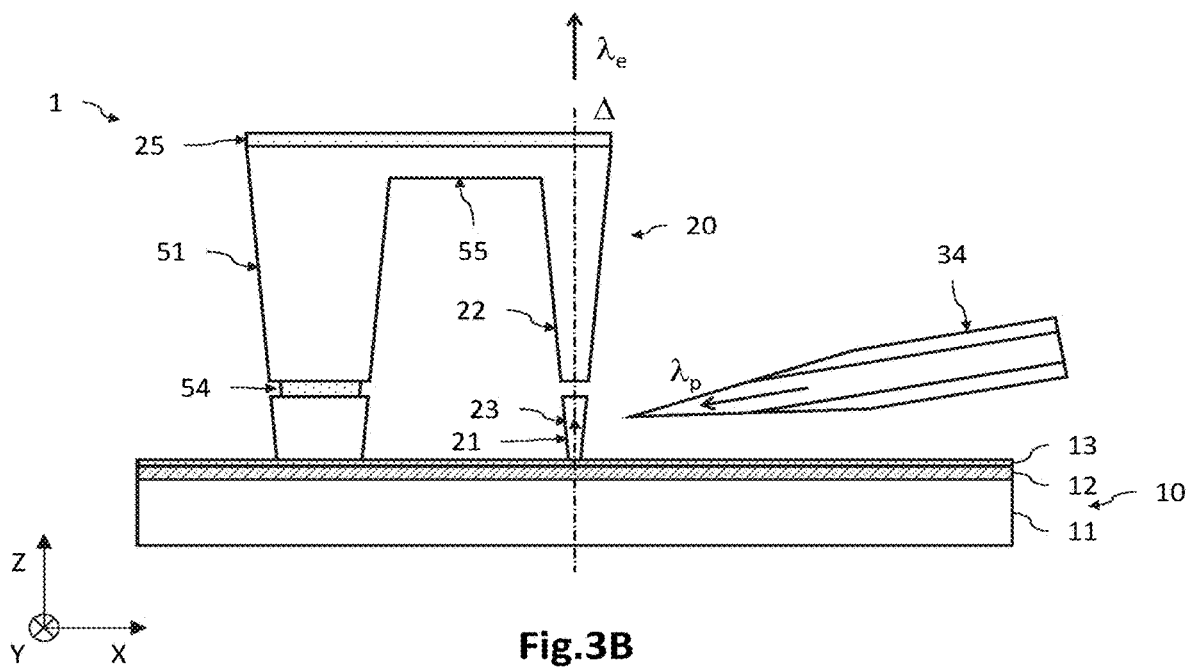
FIG. 3B is a schematic and partial view of a single-photon source comprising an optical excitation device according to a second variant.

The optical excitation device 30 thus comprises a waveguide 34 coupled to the laser source 31 and whose emission end is arranged close to and in the direction of the emitter 23 of the photonic wire 20, at a non-zero angle with respect to the longitudinal axis Δ, for example an angle greater than or equal to 45 and advantageously close to 90°. The excitation signal (laser pulse) is therefore transmitted in the direction of the quantum dot by the lateral edge of the photonic wire 20, and not by the upper end in a manner collinear with the longitudinal axis Δ. In the example of FIG. 3B, the waveguide 34 is an optical fibre whose end is tapered (its transverse dimensions decrease in the direction of its emission end). Such an optical fibre (tapered optical fibre) may be placed close to the photonic wire using a micromanipulator to within a fraction of a micron, and then joined to the support substrate 10 by way of an adhesive material (glue), for example.

The collection device 40 may then be similar to the one illustrated in FIG. 3A, and it is not necessary for it to comprise a polarizer if the quantum dot is excited by resonant pumping, in that the probability of the collection device 40 being able to collect a portion of the excitation signal diffused by the photonic wire 20 is greatly reduced. The efficiency of the single-photon source 1 is thus increased.

As mentioned above, it has been established that mechanical vibrations of the photonic wire 20, and more precisely its deformation with respect to the longitudinal axis Δ, generate mechanical stresses experienced by the emitter 23 that vary over time, thereby affecting the indiscernibility factor I of the single-photon source 1. Specifically, it appears that coupling is possible between the vibration modes supported by the photonic wire 20 (and more precisely the phonons that are present), and in this case the semiconductor quantum dot 23. Therefore, these mechanical stresses, which vary over time, may then lead to the band gap energy of the quantum dot 23 changing over time, and thus bring about a variation over time of the wavelength of the emitted photons.

Therefore, the photonic wire 20 is structured so as to reduce possible coupling between the emitter 23 and the mechanical stresses resulting from the mechanical deformation of the photonic wire 20. To this end, the photonic wire 20 is divided into two distinct parts, called lower part 21 and upper part 22, that are coaxial along the longitudinal axis Δ and spaced from one another by a non-zero distance $d_{sp}$. The lower part 21 comprises the emitter 23 and the upper part 22 preferably comprises most of the mode adapter. The upper part 22 is then suspended above the lower part 21, and is held in position by a holding structure 50.

The lower part 21 rests in contact with the support substrate 10 and comprises the emitter 23. It preferably has a height $h_1$ such that the volume of the lower part 21 is less than the volume of the upper part 22, so as to reduce the impact of the vibration modes that it is able to support on the properties of the emitter 23. Preferably, in the case of a photonic wire of flared general shape, the height $h_1$ is preferably less than half the height h, and advantageously far less than half the height h. In other words, preferably $h_1/h \leq 0.5$, and preferably $h_1/h \leq 0.1$, and more preferably $h_{pa}/h \leq 0.05$. In this example in which the height h of the photonic wire 20 is equal to around 12 μm, the height $h_1$ of the lower part 21 is equal to around 200 nm. The height $h_1$ is defined as being the distance, along the Z-axis, between the lower end of the photonic wire 20 in contact with the support substrate 10 and a substantially planar upper face oriented in the direction +Z.

The lower part 21 has a local diameter substantially equal to $\lambda_e/n$ in the cross section where the emitter 23 is located, in this case for example between 150 nm and 300 nm, preferably equal to around 200 nm.

The emitter 23 is preferably located at a distance of around 100 nm from the support substrate 10 (in this case the first interference band between the incident beam and the beam reflected by the reflective layer), so as to optimize the reflection of the guided mode, and is preferably arranged on the longitudinal axis Δ or at a distance in the XY plane less than or equal to 50 nm with respect to the longitudinal axis Δ, so as to optimize the spontaneous emission rate.

The upper part 22 is distinct and spaced from the lower part 21, in the sense that there is no direct physical contact between these two parts. It is arranged coaxially to the lower part 21 along the longitudinal axis Δ, and is suspended thereabove by a non-zero distance $d_{sp}$ along the longitudinal axis Δ.

The upper part 22 comprises at least one portion of the mode adapter, and preferably most of the mode adapter, in particular when the photonic wire 20 has a flared general shape. If the photonic wire 20 has a locally tapered form, the upper part 22 preferably comprises the whole mode adapter.

It has a height $h_2$ defined as the distance between a substantially planar lower face 22.1 oriented in the direction −Z and the upper end 20.2 of the photonic wire 20. The distance along the longitudinal axis Δ between the upper face 21.2 and the lower face 22.1 defines a spacing 24 (cf. FIG. 2A) between the two lower 21 and upper 22 parts and is denoted $d_{sp}$.

The upper part 22 is held in a position suspended above the lower part 21 by the holding structure 50, which is formed of at least one holding arm 55 that connects the upper part 22 to a pillar 51 adjacent to the photonic wire 20, in an XY plane.

The lower part 21 and the upper part 22 preferably have an identical angle of incline α on either side of the spacing 24. The photonic wire 20 thus does not have a break in the variation of the local diameter on either side of the spacing 24, that is to say an abrupt variation in the local diameter, so as thus to limit optical losses.

The spacing 24 of value $d_{sp}$ between the lower part 21 and the upper part 22 allows mechanical decoupling between the two upper 21 and lower 22 parts, while at the same time creating optical coupling of the guided mode between the two parts 21, 22. Optical coupling is understood to mean that the guided mode may transmit from one side to the other with a transmission coefficient T at least equal to 50%.

The distance $d_{sp}$ thus has a chosen value between a minimum value $d_{sp\_min}$ and a maximum value $d_{sp\_max}$. The minimum value $d_{sp\_min}$ is linked to the constraints of the method for manufacturing the single-photon source 1: specifically, this involves suspending the upper part 22 by eliminating a sacrificial layer initially located between the lower part 21 and the upper part 22. The minimum value $d_{sp\_min}$ may be of the order of 5 nm, in particular when a vapour-phase or liquid-phase hydrofluoric acid (HF) chemical attack is carried out in order to eliminate the AlAs-based sacrificial layer, for example made of Ga-depleted AlGaAs ($Ga_xAl_{1-x}As$ where $x \leq 0.4$). This minimum value $d_{sp\_min}$ may of course be adjusted depending on the material of the sacrificial layer and on the etching agent that is used.

The maximum value $d_{sp\_max}$ depends on the chosen value of the transmission coefficient T of the guided mode between the lower part 21 and the upper part 22, which depends in particular on the local diameter of the photonic wire 20 at the spacing 24 (that is to say on either side of the spacing 24). Specifically, the transmission coefficient T obviously decreases as the value $d_{sp}$ of the spacing 24 increases. In this example of a photonic wire 20 made of GaAs with a quantum dot made of InAs, for a local diameter of the photonic wire 20 at the spacing 24 of between around 160 nm and 190 nm, the coefficient T remains greater than or equal to 90% for a spacing 24 ranging from around 5 nm to 50 nm. By contrast, for a local diameter of the photonic wire 20 at the spacing 24 with a value $d_{sp}$ between around 200 nm and 300 nm, the coefficient T is greater than or equal to 90% for a spacing 24 with a value $d_{sp}$ ranging from around 5 nm to 10 nm. The local diameter of the photonic wire 20 at the spacing 24 is defined as being the average of the local diameter of the upper face 21.2 of the lower part 21 and the local diameter of the lower face 22.1 of the upper part 22 (cf. FIG. 2A). Generally speaking, the maximum value $d_{sp,max}$ is less than or equal to $\lambda_e/n$, preferably less than or equal to $\lambda_e/(2n)$, or even $\lambda_e/(4n)$, and more preferably equal to $\lambda_e/(5n)$, thus improving the transmission coefficient T.

Therefore, the value $d_{sp}$ of the spacing 24 is preferably between 5 nm and 50 nm, in particular for a local diameter of the photonic wire 20 at the spacing 24 of between 160 nm and 300 nm, in the case of a photonic wire 20 made of GaAs with a quantum dot made of InAs. Preferably, the value $d_{sp}$ is between 5 nm and 50 nm for a local diameter at the spacing 24 of between 160 nm and 190 nm, and is preferably between 5 nm and 10 nm for a local diameter at the spacing 24 of between 200 nm and 300 nm.

The holding structure 50 suspends the upper part 22 above the lower part 21 (cf. FIGS. 2A and 2B). It comprises at least one pillar 51 resting on the support substrate 10 and arranged adjacent to the photonic wire 20, and at least one holding arm 55 connecting the suspended upper part 22 to the pillar 51. In this example, the structure comprises a plurality of pillars 51 arranged around the photonic wire 20, the upper part 22 being connected to the pillars 51 by holding arms 55.

The pillars 51 have a height to transverse dimensions form ratio such that they are substantially rigid, that is to say are not deformable or are only slightly deformable in a plane orthogonal to the Z-axis. They have a height substantially equal to that of the photonic wire 20 and are based on the same crystalline material as that of the photonic wire 20, specifically in this case GaAs. They have a local diameter at the lower end 51.1 in contact with the support substrate 10 preferably at least equal to several hundred nanometres, for example greater than or equal to 2 µm or more.

In this example, each pillar 51 comprises a spacer layer 54 in an XY plane, arranged between two parts 52, 53 made of GaAs, and coplanar with the spacing 24 of the photonic wire 20. This spacer layer 54 is made from the sacrificial material used in the manufacturing method to suspend the upper part 22 above the lower part 21. While the local diameter of the photonic wire 20 at this sacrificial material is low and allows the upper part 22 to be suspended, the local diameter of each pillar 51 at this sacrificial material 54 is large, such that it is not entirely eliminated, and therefore creates mechanical contact between the two parts 52, 53 made from GaAs.

The holding arms 55 create the mechanical connection between the upper part 22 of the photonic wire 20 and the pillars 51. They may be made from the high-index crystalline material, here from GaAs, or be made from a different material. They have a height of the order of a few hundred nanometres to a few microns, for example 1.5 µm, and a maximum width in the plane of the upper end of the order of a few hundred nanometres, for example 200 nm. In this example, the holding arms 55 are made from GaAs and were obtained in an RIE etching step of producing the photonic wire 20. They therefore have a local width that decreases in the direction −Z. The maximum width is less than the local diameter of the photonic wire 20 at the upper end 20.2, preferably less than or equal to a fifth of the local diameter. The holding arms 55 may have a length in the XY plane of the order of a few microns, for example 6 µm. The holding arms 55 extend, at the interface with the photonic wire 20, from the lateral edge of the photonic wire 20, over a given height of the upper part 22 along the Z-axis, and in the direction of the pillars 51 in the XY plane.

If the holding structure 50 comprises a plurality of pillars 51 and holding arms 55, at least two pillars 51 are arranged opposite in pairs about the longitudinal axis Δ. In the case of an odd number of pillars 51, these may be arranged so as to exhibit an odd order of rotational symmetry about the longitudinal axis Δ.

Therefore, dividing the photonic wire 20 into two coaxial parts that are distinct and remote from one another along the longitudinal axis Δ makes it possible to obtain a single-photon source 1 whose indiscernibility factor I is greatly improved in comparison with the example from the prior art described with reference to FIG. 1B.

Specifically, dividing the photonic wire 20 makes it possible to reduce the influence of mechanical vibrations of the photonic wire 20 on the properties of the emitter 23. More precisely, the temporal variations in the mechanical deformation of the photonic wire 20 have a greatly reduced impact on the emitter 23 due to the mechanical decoupling between the upper part 22 and the lower part 21 of the photonic wire 20. Specifically, dividing the photonic wire 20 into two distinct parts leads to a reduction in the number of vibration modes that the lower part 21 may support, which vibration modes moreover have a high frequency. This leads to a large reduction in the likelihood of coupling between such a vibration mode and the emitter 23, thus improving the indiscernibility factor I. Moreover, the efficiency of the single-photon source 1 remains particularly high due to the high optical coupling between the lower part 21 and the upper part 22.

Figure 1B:
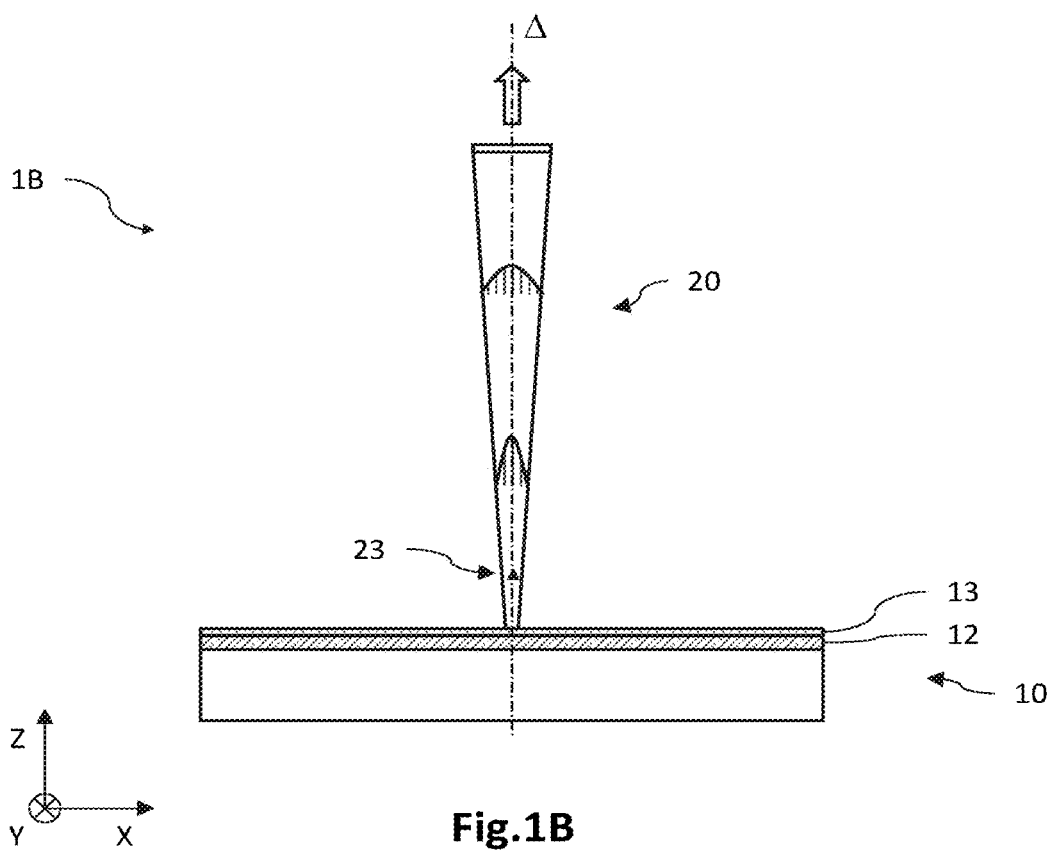
Figure 4A:
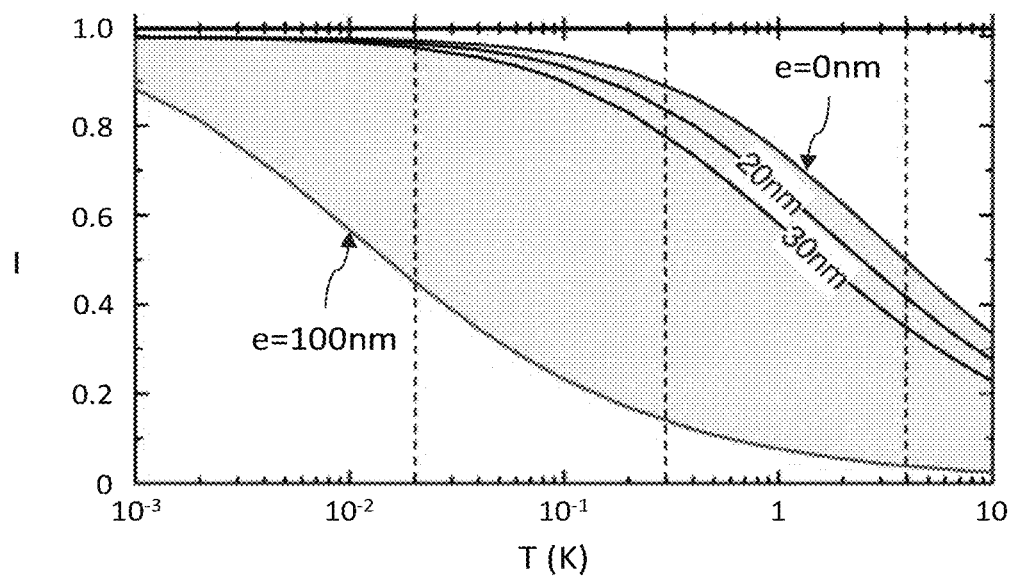
FIGS. 4A and 4B are examples of the evolution of the indiscernibility factor I as a function of the temperature T of the photonic wire of the single-photon source, for a photonic wire according to one example from the prior art (FIG. 4A) and for a photonic wire similar to that of the first embodiment (FIG. 4B)

To this end, FIG. 4A illustrates the evolution of the indiscernibility factor I as a function of temperature T in the case of a photonic wire 20 according to the example from the prior art illustrated in FIG. 1B.

Generally speaking, the vibrations of the crystal lattice of the high-index crystalline material of the photonic wire 20 may lead to mechanical stresses forming in the semiconductor quantum dot. An (acoustic) phonon corresponds to a vibration mode of the crystal lattice, and may therefore couple with the semiconductor quantum dot. This coupling depends in particular on the temperature of the photonic wire 20. Using cryogenic temperatures makes it possible to greatly reduce the population of phonons supported by the photonic wire 20, and therefore the coupling between the quantum dot and the phonons. However, this remains non-zero and therefore affects the indiscernibility factor I.

In this example, the photonic wire 20 has a flared general shape and has a height of around 12 m, a local diameter at the upper end of around 1.5 µm and a constant angle of incline α along the longitudinal axis Δ of around 3°. It is made from GaAs and comprises a single quantum dot made of InAs and located 100 nm above the support substrate 10. This may be arranged facing the longitudinal axis Δ with a gap e of zero, a gap of 20 nm, 30 nm or be arranged on the lateral edge (e=100 nm). The various characteristic curves of this gap e are illustrated in FIG. 3A. The photonic wire 20 rests in contact with a dielectric layer 13 made of $Si_3N_4$ with a thickness of around 10 nm, and is arranged facing, along the Z-axis, a reflective layer 12 made of gold with a thickness of around 200 nm.

The evolution of the indiscernibility factor I as a function of the temperature of the photonic wire 20 was obtained here by simulating the mechanical vibration modes using the COMSOL Multiphysics software, and by applying the formalism outlined in the article by Muljarov & Zimmermann entitled *Dephasing in Quantum Dots: Quadratic Coupling to Acoustic Phonons*, Phys. Rev. Lett, 93, 237401 (2004).

It appears firstly that the indiscernibility factor I decreases differently as the temperature increases, depending on whether the quantum dot is located on the longitudinal axis Δ or is axially offset from the axis by a gap e. Thus, at a given temperature, the indiscernibility factor I is higher when the quantum dot is close to the longitudinal axis Δ. It also appears that the indiscernibility factor exhibits a significant drop starting from 0.03 K as the temperature T increases, when the quantum dot is close to the longitudinal axis Δ (e≤30 nm). Thus, at the temperature of 4 K, the indiscernibility factor I has a value of around 50% when the quantum dot is on the longitudinal axis Δ (e=0 nm), and it has a value of around 5% when it is located on the lateral edge (e=100 nm) of the photonic wire 20.

Figure 4B:
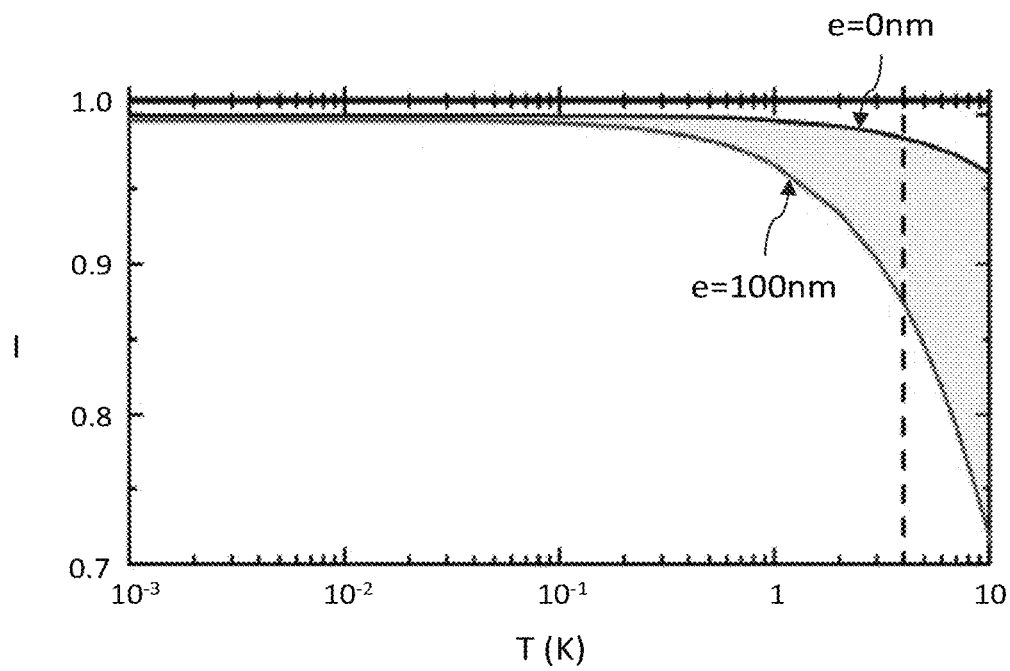
Figure 5A:
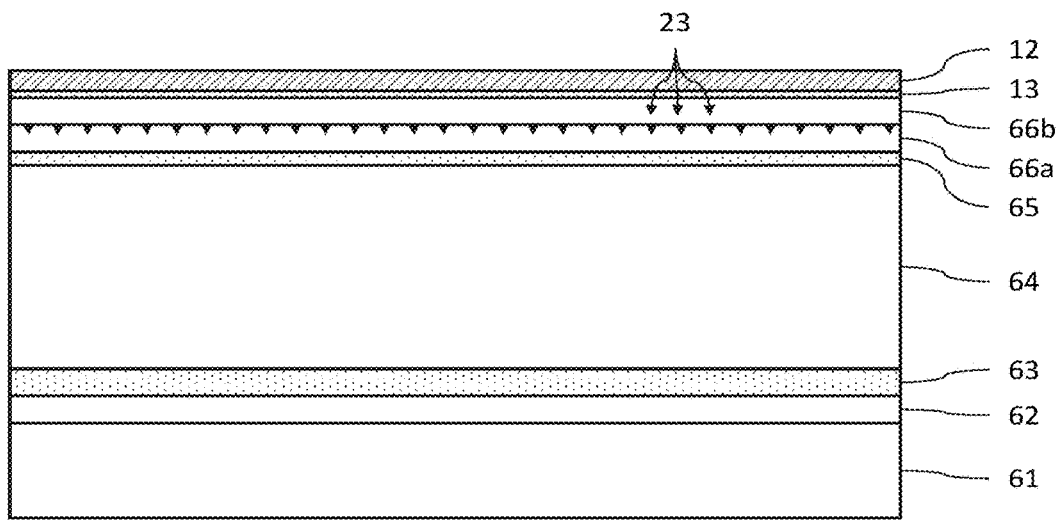
FIGS. 5A to 5H illustrate various steps of a method for manufacturing a single-photon source similar to that of the first embodiment.
Figure 5B:
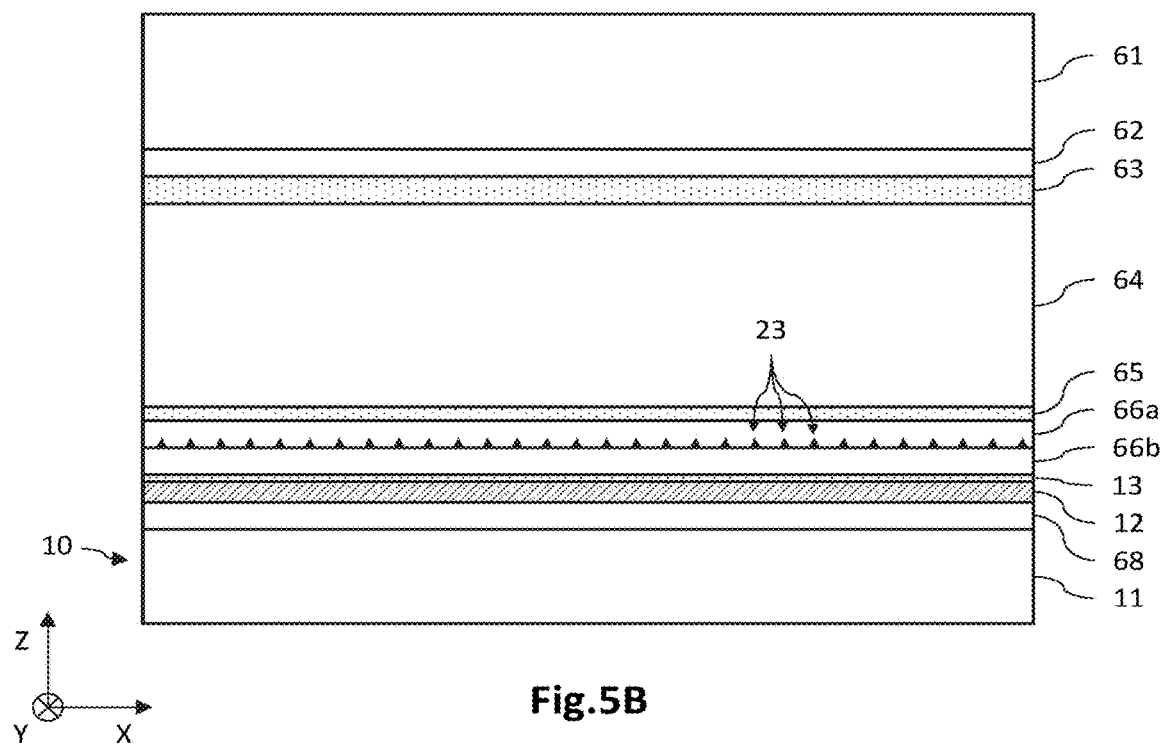
Figure 5C:
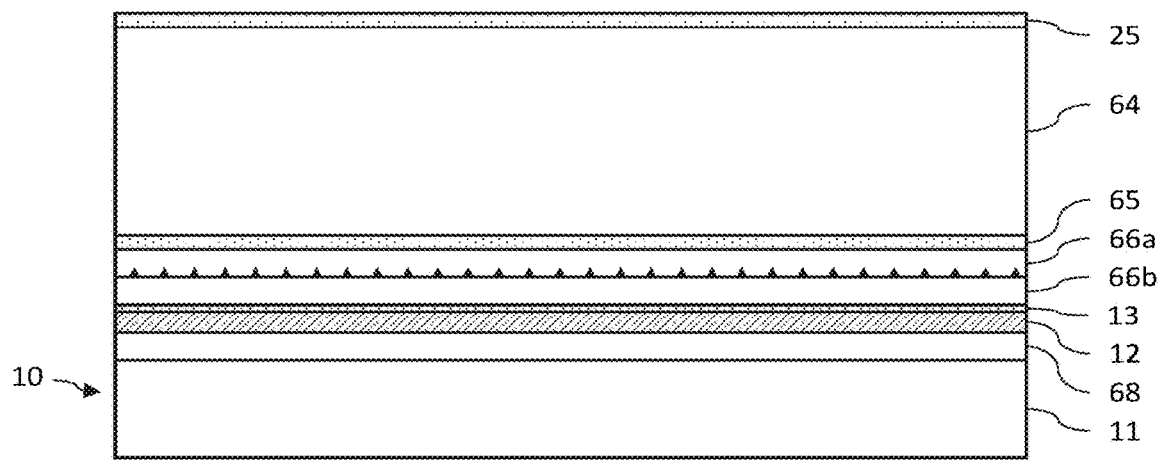
Figure 5D:
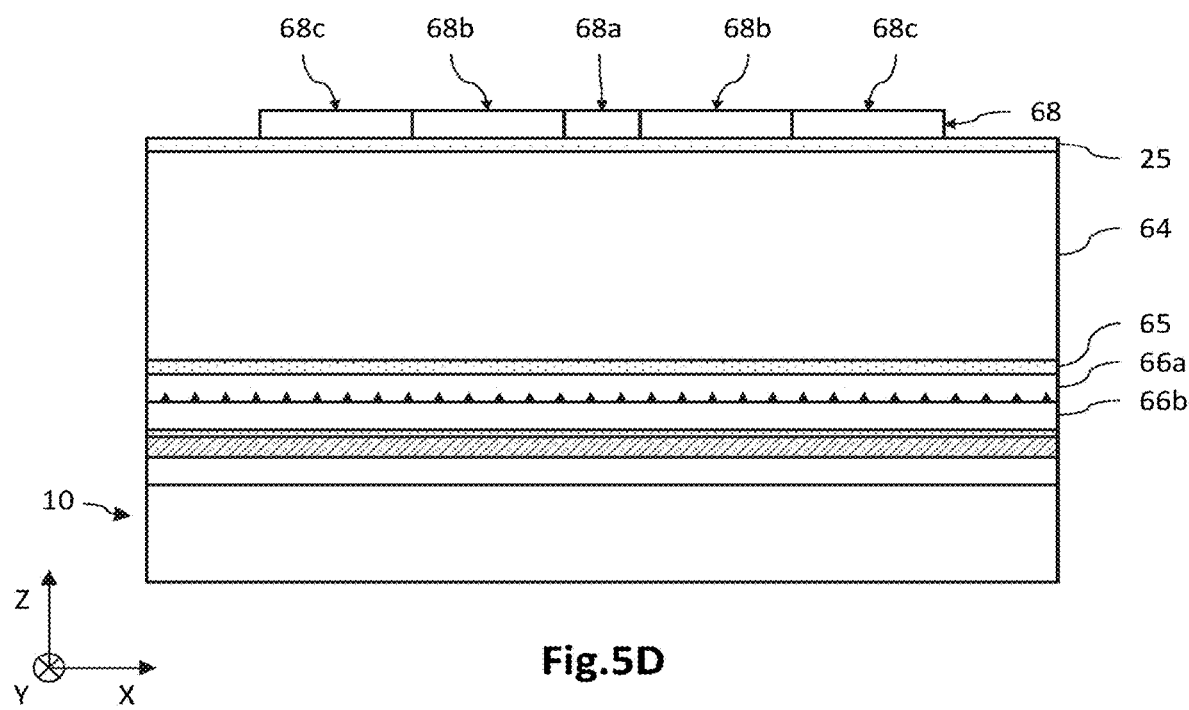
Figure 5E:
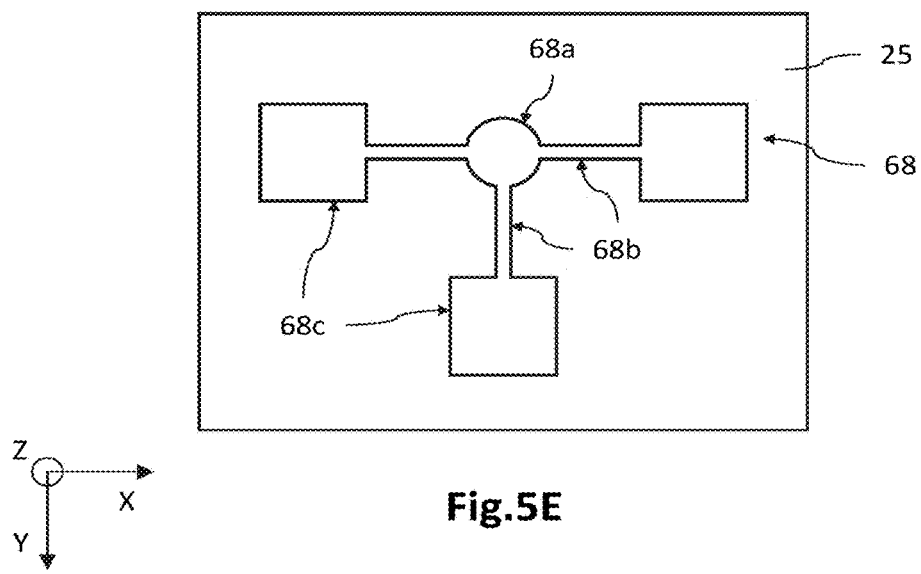
Figure 5F:
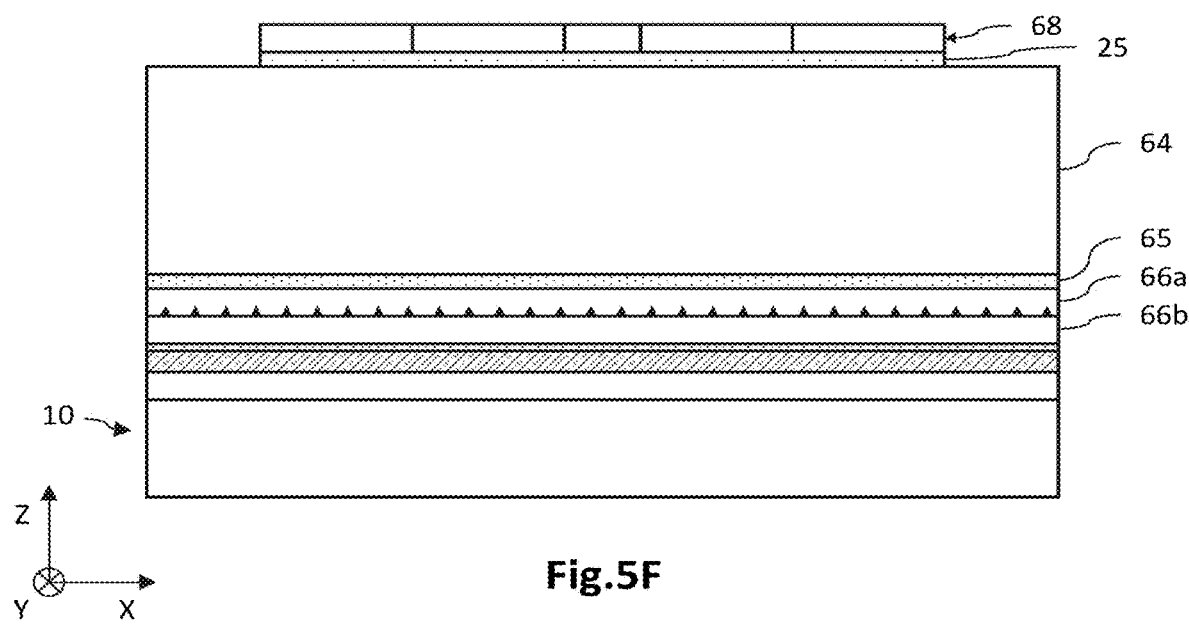
Figure 5G:
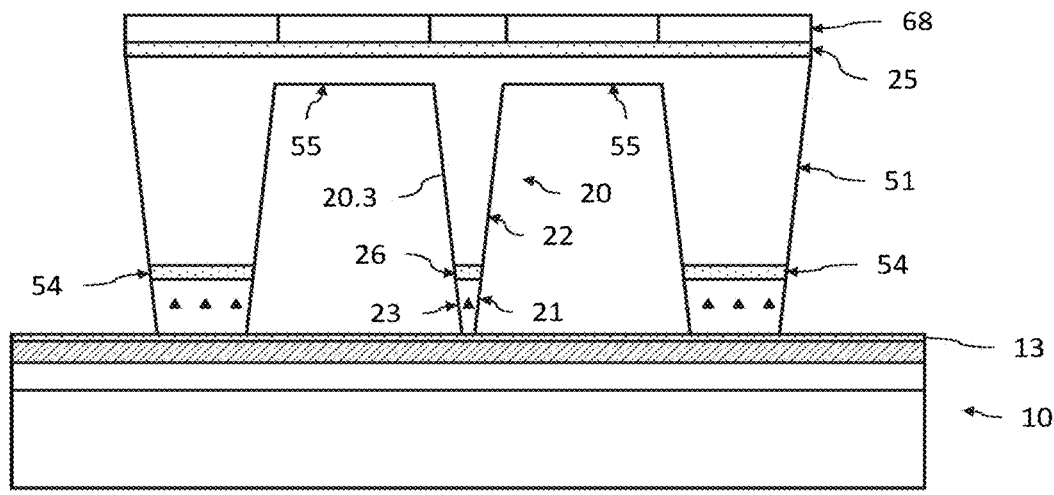
Figure 5H:
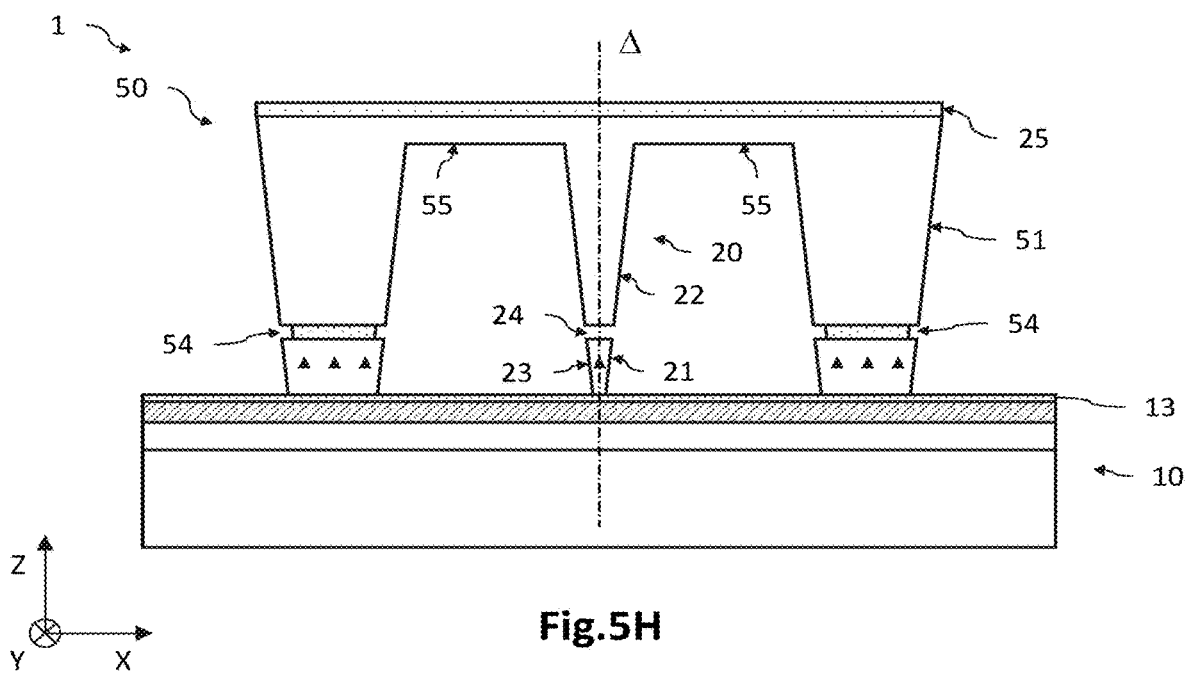

FIG. 4B illustrates the evolution of the indiscernibility factor I as a function of the temperature T in the case of a photonic wire 20 according to the first embodiment.

In this example, the photonic wire 20 is similar to the one corresponding to FIG. 4A, and differs therefrom essentially in that it is divided into two parts, a lower part 21 comprising a quantum dot made of InAs and having a height of around 200 nm. The upper part 22 is spaced from the lower part 21 by a value $d_{sp}$ equal to 10 nm, and is held suspended by four holding arms 55 that are opposite in pairs about the longitudinal axis Δ. Each holding arm 55 has a maximum width of 200 nm at the upper end of the photonic wire 20, which decreases in the direction −Z over a height of around 1.5 μm. The holding arms 55 have a length of 6 μm.

It appears that the indiscernibility factor I is greatly improved in comparison with the photonic wire 20 from the prior art. Specifically, if the quantum dot is on the longitudinal axis Δ (e=0 nm), the factor I remains greater than or equal to 0.97 for a temperature less than or equal to 4 K. At the temperature of 4 K, this corresponds to an improvement in the indiscernibility factor I of around 94%. If the quantum dot is located on the lateral edge (e=100 nm), the factor I remains greater than or equal to around 0.87 for a temperature less than or equal to 4 K. At the temperature of 4 K, this corresponds to an improvement in the indiscernibility factor I of more than around 1600%. Thus, dividing the photonic wire 20 into two distinct and coaxial parts as described above makes it possible to greatly reduce the influence of the mechanical vibrations of the photonic wire 20 on the properties of the emitter 23, and thus to obtain a particularly high indiscernibility factor I.

It will moreover be noted that the single-photon source 1 retains the advantageous features inherent to monomode photonic wires. Specifically, such a single-photon source 1 has a purity factor P (absence of a spontaneously emitted pulse containing more than 1 photon) close to 1, and an efficiency factor E (probability of the spontaneously emitted pulse effectively containing 1 photon) close to 1. The photonic wire 20, through the mode adaptor, has an emission pattern with a low numerical aperture, thereby allowing effective coupling to an external waveguide 43. Moreover, it is possible to produce a single-photon source 1 with a tunable wavelength, by applying an external field to the lower part 21 of the photonic wire 20 (for example electric field or mechanical stress field generated by a piezoelectric actuator) that modifies the band gap energy of the semiconductor quantum dot, without this affecting the efficiency factor E of the single-photon source 1.

One example of a method for manufacturing the single-photon source 1 according to the first embodiment is now described with reference to FIGS. 5A to 5H, which illustrate various steps of the method.

In a first step (FIG. 5A), a stack of epitaxial layers is produced from a first substrate 61. The first substrate 61 is preferably made from a crystalline material having a small difference in the lattice parameter from the main crystalline material of the photonic wire 20. In this example, the first substrate 61 is made from GaAs.

The epitaxy of the layers in question may be molecular beam epitaxy (MBE) or metal organic chemical vapour deposition (MOCVD) epitaxy or any other equivalent epitaxy technique.

The stack is formed of the following layers, arranged on top of one another, starting from the first substrate:
- a first layer 62, called buffer layer, made of GaAs with a thickness of around 500 nm, deposited in contact with the first substrate 61;
- a first sacrificial layer 63, for example based on AlAs, in this case AlGaAs with 80% at. Al, with a thickness of around 500 nm;
- a second layer 64 made of the high-index crystalline material of the photonic wire 20, in this case made of GaAs, with a thickness corresponding to the desired height $h_2$ of the upper part 22, for example around 12 μm;
- a second sacrificial layer 65, for example based on AlAs, in this case AlGaAs with 80% at of Al, with a thickness corresponding to the desired distance $d_{sp}$ of the spacing 24 between the lower part 21 and the upper part 22, for example a thickness of between 5 nm and 50 nm;
- a sub-layer 66a made of the high-index crystalline material, in this case made of GaAs, intended to form a portion of the lower part 21, for example with a thickness of around 100 nm;
- an active layer, formed of a wetting layer made from the semiconductor compound forming the quantum dots 23, for example made of InAs, and quantum dots (only the quantum dots 23 are shown, in this case by triangles);
- another sub-layer 66b made of the high-index crystalline material, in this case made of GaAs, intended to form another portion of the lower part 21, for example with a thickness of around 100 nm.

The active layer is produced using the technical knowledge of a person skilled in the art, using for example the conditions described in the article by Gérard et al. entitled *Optical investigation of the self-organized growth on InAs/GaAs quantum boxes*, J. Crystal Growth, 150, 351 (1995). It may have a thickness of the order of 0.5 nm and comprise quantum dots arranged in the XY plane with a surface density for example equal to 200 quantum dots per micron.

The reflective layer is then produced starting from the free face of the stack. To this end, the stack is covered with a dielectric layer 13, made from a material that is dielectric on the one hand and inert to an etching agent used subsequently in a step of producing the photonic wire 20 and the holding arms 55 and the pillars 51, and inert to the etching agent used in the step of dividing the photonic wire 20 (suspension from the upper part 22). The dielectric layer 13 may be a silicon nitride, for example $Si_3N_4$ with a thickness of around 10 nm.

The dielectric layer 13 is then covered with a reflective layer 12 reflective to the wavelength of the photons emitted by the single-photon source 1. The reflective layer 12 may be made from a metal material such as gold with a thickness of around 100 nm and 300 nm.

In a following step (FIG. 5B), the stack that is formed is joined to a second substrate 11. To this end, the free face of the reflective layer 12 is put into contact with an adhesive layer 68 made from an adhesive material that covers a second substrate 11. This may be made from a possibly semiconductor crystalline material, for example doped or undoped GaAs. The adhesive layer 68 may be made from an epoxy adhesive, or from a polymer such as PDMS or PMMA. Any other joining technique may be used. The support substrate 10 on which the photonic wire 20 is intended to rest is then formed from the second substrate 11, from the adhesive layer 68, from the reflective layer 12 and from the dielectric layer 13.

In a following step (FIG. 5C), the stack is thinned so as to free a face of the second layer 64 made of GaAs. To this end, the first substrate 61 is for example thinned through chemical-mechanical polishing until retaining a thickness of GaAs of between around 50 μm and 100 μm. The thinned first substrate 61 and the buffer layer 62 are then chemically etched using an etching agent that is selective with respect to the first sacrificial layer 63. The first sacrificial layer 63 is finally chemically etched using an etching agent that is selective with respect to the main crystalline material, for example through HF (hydrofluoric acid) etching. A free face of the second layer 64 made of GaAs having good optical properties (low roughness) is thus obtained, thus minimizing any optical losses at this face.

In a following step, an anti-reflective layer 25 is deposited on the free face of the second layer 64 made of GaAs. This anti-reflective layer 25 forms a quarter-wave plate of thickness $\lambda_e/(4n_{ar})$ where $n_{ar}$ is the refractive index of the anti-reflective layer 25, which is close to in (n being the refractive index of the high-index crystalline material, here GaAs). It may be made for example from a silicon nitride, for example $Si_3N_4$ deposited using plasma-enhanced chemical vapour deposition (PECVD).

In a following step (FIGS. 5D and 5E), an etch mask 68 is produced so as to partially cover the anti-reflective layer 25. The etch mask 68 is intended to delimit the photonic wire and the holding structure 50 (pillars 51 and arms) in the XY plane. The etch mask 68 is in this case made from nickel Ni through lithography and lift-off. It thus comprises a central part 68a intended to form the photonic wire 20, the dimensions of which in the XY plane define that of the upper end 20.2 of the photonic wire 20. It in this case comprises a plurality of lateral parts 68c intended to form the pillars 51, which are connected to the central part 68a by narrow spacer parts 68b intended to form the holding arms 55. In this example, the photonic wire 20 is mechanically connected to three adjacent pillars 51.

The central part 68a may have a rounded shape, for example a circular or oval shape, or a polygonal shape. It is in this case circular and has a diameter $d_{pc}$ that depends on the etching angle $\alpha$, which corresponds to the angle of incline formed by the orientation of the lateral edge 20.3 of the photonic wire 20 with respect to the Z-axis, and by the desired height h of the photonic wire 20. Given that it is desired for the local diameter of the photonic wire in the plane of the quantum dot 23 to be substantially equal to $d_{bq}=\lambda_e/n$ at a height of the order of 100 nm above the support substrate 10, the diameter of the central part 68a is substantially equal to $d_{bq}+2\times h\times\tan(\alpha)$. It is assumed here that the height of 100 nm of the quantum dot 23 with respect to the support substrate 10 is negligible in comparison with the total height h of the photonic wire 20.

The width $l_b$ of the spacer parts 68b is preferably constant in the XY plane and has a value chosen depending on the etching angle $\alpha$ and on the desired height $h_b$ of the holding arms 55. The width $l_b$ may thus be substantially equal to $2\times h_b\times\tan(\alpha)$. Thus, for a height of the holding arms 55 of the order of 1 μm, and an etching angle of the order of 3°, the width $l_b$ of the spacer parts is of the order of around 100 nm.

The lateral parts 68c may have a rounded or polygonal shape, for example a square shape here. They have transverse dimensions in the XY plane, in this case a width $l_{pl}$, chosen depending on the etching angle $\alpha$ and on the desired width at the end face 51.1 of the pillars 51 in contact with the support substrate 1o. As described further below, the pillars 51 have to be wide enough for the spacer layer 54 that they comprise not to be etched completely following the step of dividing the photonic wire 20. By way of example, for a pillar 51 whose lower width in contact with the support substrate 10 is equal to around 1 μm, and for a height of around 12 μm, the width $l_{pl}$ of the lateral parts is substantially equal to around 2.25 μm.

In a following step (FIG. 5F), the anti-reflective layer 25 is locally etched so as to eliminate the parts that are not covered by the etch mask. The etching may be performed for example through reactive ion etching (RIE), and preferably such that the etched edges of the anti-reflective layer 25 are substantially oriented along the Z-axis. The second layer 64 made of GaAs thus has an upper face with a free surface, that is to say a surface not covered by the anti-reflective layer 25 and by the etch mask 68.

In a following step (FIG. 5G), the photonic wire 20 and the holding arms 55 and the pillars 51 are produced, in this case through localized etching of the stack. The etching may be performed through reactive ion etching (RIE), the characteristics of which in terms of physical etching and chemical etching are defined so as to obtain the desired etching angle $\alpha$, for example around 3°. The dielectric layer 13 forms an etch stop layer. Therefore, the etching agent etches, in the XY plane, part of the second layer 64 made of GaAs, part of the second sacrificial layer 65 and part of the two sub-layers 66a, 66b made of GaAs. What is thus obtained is a photonic wire 20 that contains one or more quantum dots 23 at a height of around 100 nm for which the local diameter is substantially equal to around 200 nm. The photonic wire 20 extends continuously along the Z-axis between the anti-reflective layer 25 and the support substrate 10, and the second sacrificial layer 65 becomes a spacer portion 26 that contributes to forming the lateral edge 20.3 of the photonic wire 20 oriented along the angle of incline $\alpha$. It also creates the mechanical connection between the upper part 22 and the lower part 21. The holding arms 55 made of GaAs are also obtained, these having a desired height $h_{bm}$, in this case of the order of 1 μm, and the pillars 51 are obtained, these having desired transverse dimensions at the point of contact with the support substrate 10. The holding arms 55 create a mechanical connection between the pillars 51 and the photonic wire 20. The anti-reflective layer 25 continuously covers the upper face of the photonic wire 20, the holding arms 55 and the pillars 51. Following this step, the etching mask is eliminated, for example using an acid solution.

In a following step (FIG. 5H), the photonic wire 20 is divided, in order words the upper part 22 of the photonic wire 20 is suspended above the lower part 21. To this end, the material of the second sacrificial layer based on AlAs is chemically etched, this chemical etching being selective with respect to the high-index crystalline material (in this case the GaAs) of the second layer and of the two sub-layers and with respect to the dielectric material (in this case an SiN) of the dielectric layer 13. The etching agent is preferably hydrofluoric (HF) acid in the vapour phase. The etching time is chosen so as to suspend the upper part 22 above the lower part 21 without a direct mechanical connection between these parts, without the sacrificial layer present in the pillars 51 however being completely etched. The vertical mechanical connection between the layers made of GaAs within the pillars 51 therefore remains intact. The upper part 22 is then suspended above the lower part 21 by the holding arms 55, which mechanically connect the upper part 22 to the adjacent pillars 51.

In this example, the photonic wire 20 may comprise a plurality of quantum dots located in one and the same XY plane of its lower part 21. Specifically, the cross section where the quantum dots are located has a surface area of the order of 0.04 μm² and the quantum dot density is of the order of 200/μm². As a result, there are on average around 8 quantum dots in the lower part 21 of the photonic wire 20, randomly spatially distributed in one and the same cross section. These quantum dots may thus be arranged at various distances from the longitudinal axis Δ, and emit photons at different wavelengths from one quantum dot to another (size variability).

In this case, as described above, the collection device 40 of the single-photon source 1 advantageously comprises a spectral filter 41 (cf. FIG. 3A) so as to isolate the photons emitted by a chosen quantum dot, preferably the one closest to the longitudinal axis Δ in that it has the highest spontaneous emission rate.

What is thus obtained is a single-photon source 1 formed of a photonic wire 20 divided into two parts that are distinct and spaced from one another, and arranged coaxially with respect to the longitudinal axis Δ. The mechanical decoupling between these two parts makes it possible to greatly improve the indiscernibility factor I of the single-photon source 1, while the optical coupling between the two parts is maintained. The holding structure 50 holds the upper part 22 in a position suspended above the lower part 21.

Figure 6A:
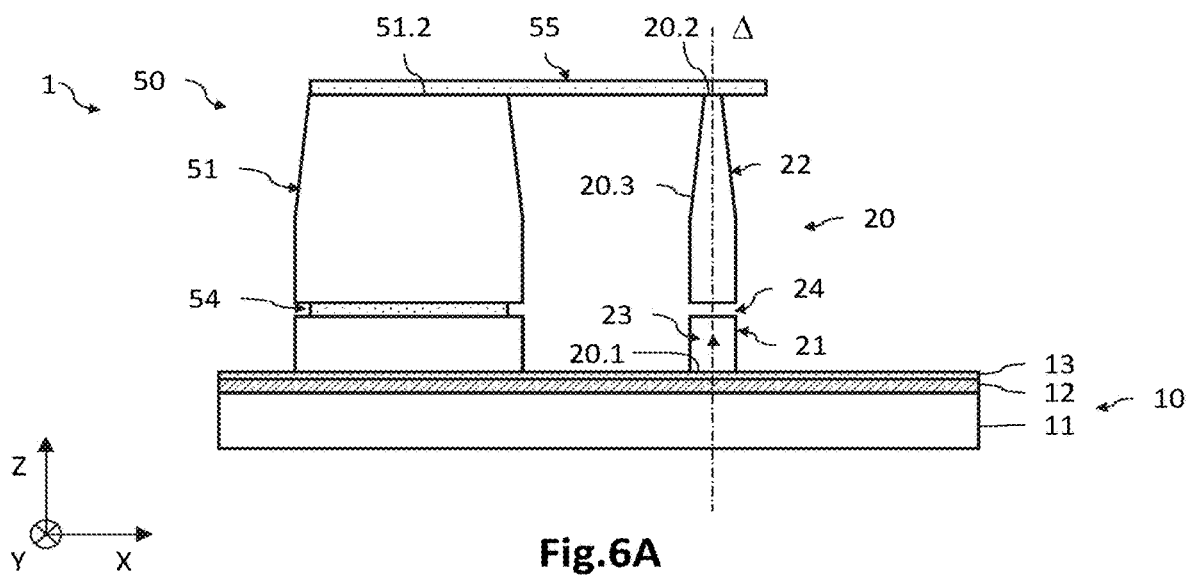
FIGS. 6A and 6B are schematic and partial longitudinal sectional (FIG. 6A) and plan (FIG. 6B) views of a single-photon source according to a second embodiment in which the photonic wire has a tapered shape.
Figure 6B:
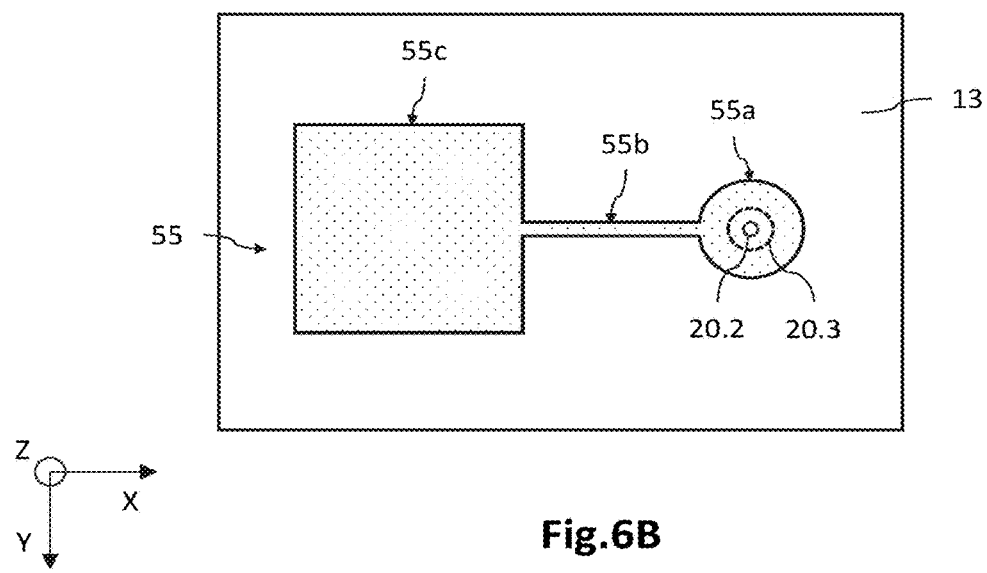
Figure 7A:
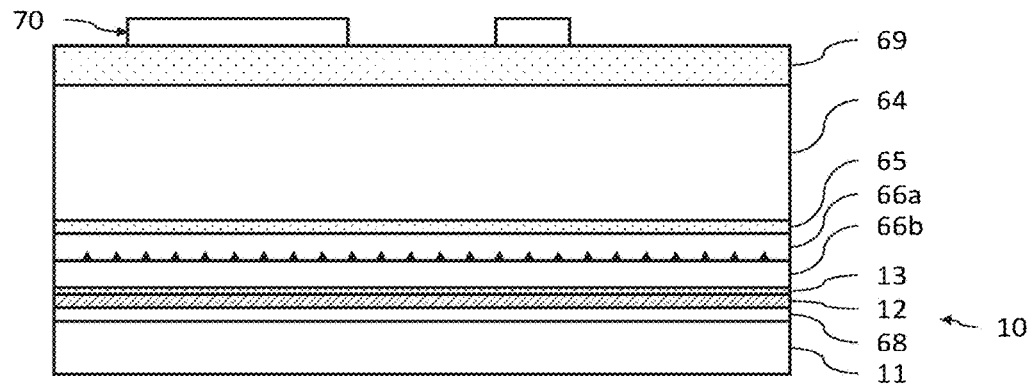
FIGS. 7A to 7F illustrate various steps of a method for manufacturing a single-photon source according to the second embodiment.
Figure 7B:
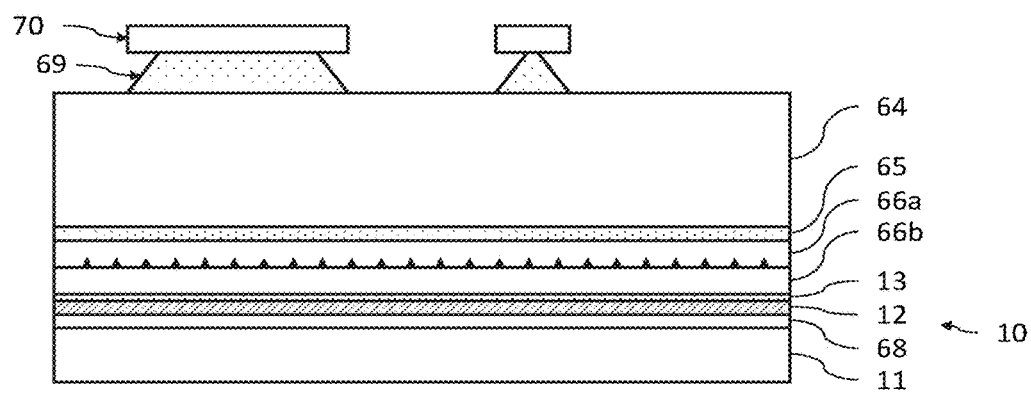
Figure 7C:
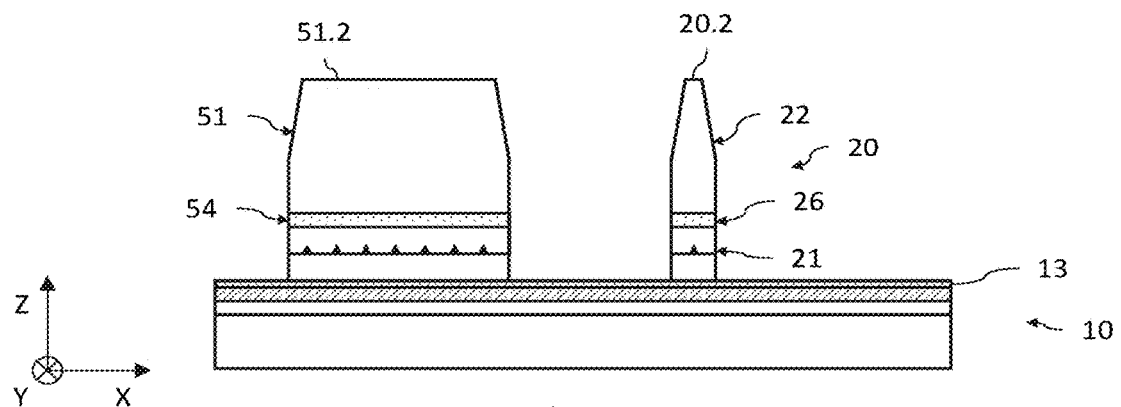
Figure 7D:
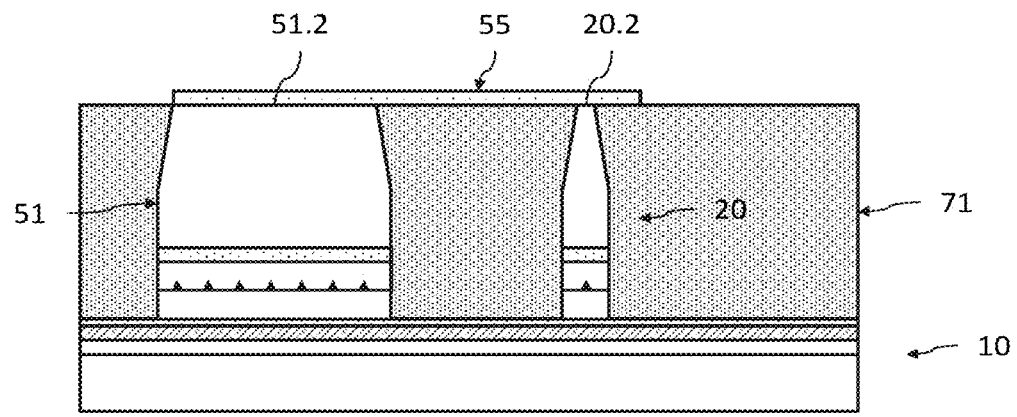
Figure 7E:
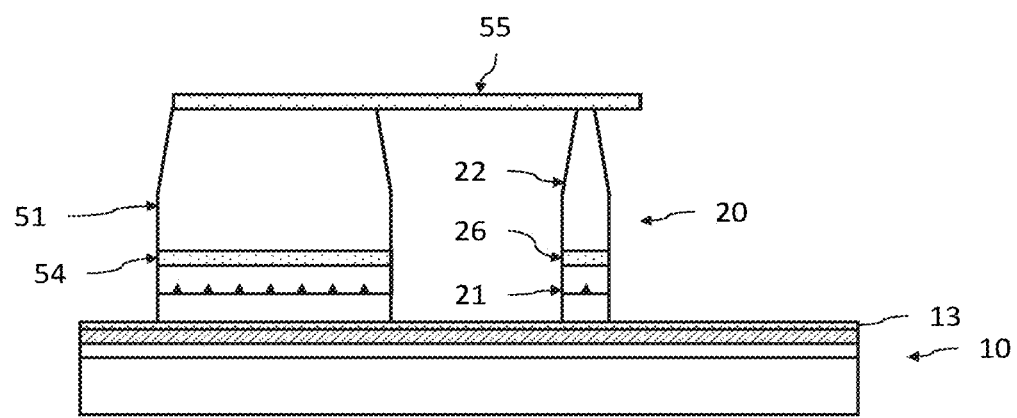
Figure 7F:
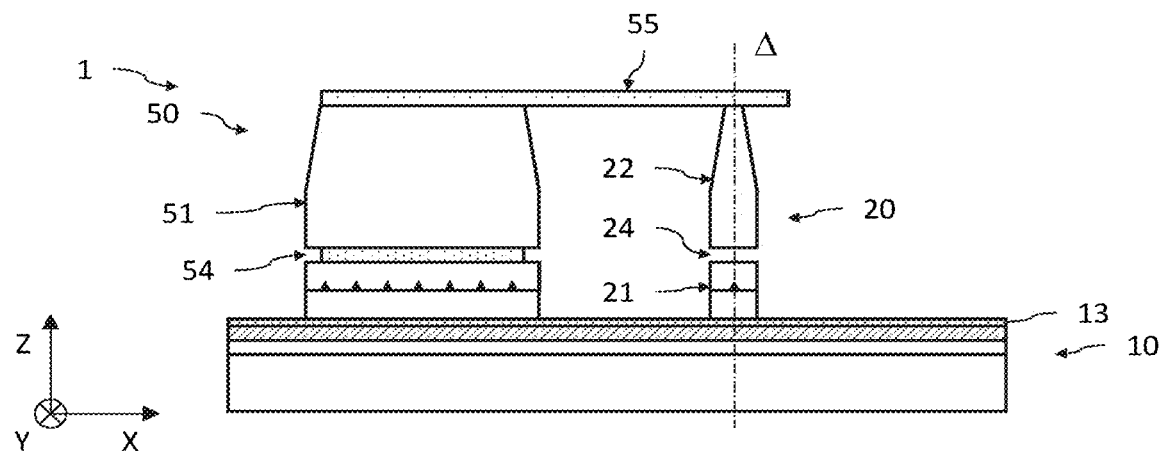

FIGS. 6A and 6B are schematic and partial longitudinal sectional (FIG. 6A) and plan (FIG. 6B) views of a single-photon source 1 according to a second embodiment.

The single-photon source 1 differs from that of the first embodiment essentially in that the photonic wire 20 has a tapered shape. The photonic wire 20 forms a monomode waveguide for the photons emitted by the emitter 23, and comprises a mode adapter in the upper part 22 that optimizes light extraction and makes it possible to achieve a Gaussian emission pattern with a small numerical aperture. In this example, the photonic wire 20 is based on GaAs and comprises at least one semiconductor quantum dot made of InAs.

As above, the lower part 21 rests in contact with the support substrate 10 and comprises the emitter 23. In this case, it has a local diameter in the cross section containing the quantum dot of close to $\lambda_e/n$, for example in this case around 200 nm. It has a height $h_1$ in this case equal to around 200 nm. The emitter 23 is arranged at a height of around 100 nm with respect to the support substrate 1o. In this example, the lower part 21 has a substantially constant local diameter along the longitudinal axis Δ.

The upper part 22 is arranged coaxially to the lower part 21 with respect to the longitudinal axis Δ. It is suspended above the lower part 21 by a spacing 24 with a value $d_{sp}$ of preferably between 5 nm and 50 nm. There is thus mechanical decoupling between the lower and upper parts, but the optical coupling between the two parts is maintained with a high transmission coefficient T of the guided mode.

The upper part 22 in this case has a first portion whose local diameter is substantially constant along the longitudinal axis Δ, and equal to $\lambda_e/n$, for example in this case around 200 nm, and a second portion that extends as far as the upper end and whose local diameter decreases gradually in the direction +Z so as to form a mode adapter.

The holding structure 50, in this case formed of a pillar 51 and a holding arm 55, holds the upper part 22 in a position suspended above the lower part 21. As in the first embodiment, the pillar 51 is based on the same material as the high-index crystalline material of the photonic wire 20.

Unlike the first embodiment, the holding arm 55 is not based on the high-index crystalline material, but made from a different material. It is formed of a bearing portion 55c that rests on the upper end 51.2 of the pillar 51, a spacer portion 55b with a narrow width, and a holding portion 55a that is joined to the upper part 22.

The holding arm 55 is in this case based on an electrically insulating material, for example a silicon nitride such as $Si_3N_4$. It has a thickness chosen so as to reduce any absorption of the photons emitted by the photonic wire 20 by the holding arm 55, and forms for example a half-wave plate of thickness $\lambda_e/(2n_{bm})$, for example equal to around 250 nm in the case of $Si_3N_4$ and with an emission wavelength $\lambda_e$ equal to around 950 nm.

The holding portion 55a preferably has an average dimension in the XY plane greater than the maximum local diameter (in this case 200 nm) of the photonic wire 20, for example at least twice as great as the maximum local diameter. The holding portion 55a preferably has a shape in the XY plane having rotational symmetry about the longitudinal axis Δ, so as to reduce any degradation of the emission pattern of the light beam emitted by the photonic wire 20.

The single-photon source 1 according to the second embodiment has the same advantages as those described above, which are not described again here.

One example of a method for manufacturing the single-photon source 1 according to the second embodiment is now described with reference to FIGS. 7A to 7F, which illustrate various steps of the method. The manufacturing method comprises steps similar to those described in the article by Claudon et al. entitled *Harnessing Light with Photonic nanowires: Fundamentals and Applications to Quantum Optics*, ChemPhysChem, 14, 2393-2402 (2013).

In a first step (FIG. 7A), a stack similar to the one described above with reference to FIG. 5D is produced. This stack in this case differs from the one described above in that the second layer 64 made of GaAs is covered with a layer 69 made of a silicon nitride, for example $Si_3N_4$. An etch mask 70 locally covers the layer 69 of $Si_3N_4$, and may be made for example of aluminium Al and is defined in the XY plane by electron beam lithography (e-beam lithography).

In a following step (FIG. 7B), the layer 69 of $Si_3N_4$ is partially etched, through reactive ion etching, such that it forms a (truncated) cone above the area intended to define the photonic wire 20. Another cone is also formed above the area intended to define the pillar 51. The cones form an angle of incline α' of the order or 20° with respect to the Z-axis.

In a following step (FIG. 7C), the underlying stack based on GaAs is partially etched through reactive ion etching. The stack of GaAs is etched vertically, and the etch mask 70 is gradually also etched. Starting from the time when the etch mask 70 is totally eliminated, the cone of $Si_3N_4$ is directly exposed. The selective ion etching continues, such that the conical shape of the $Si_3N_4$ is transferred to the GaAs. What is thus obtained is a photonic wire 20 whose upper end 20.2 may or may not be covered with a residue of the cone of $Si_3N_4$, on the side of which the pillar 51 of the holding structure 50 is located.

In a following step (FIG. 7D), the assembly thus obtained is encapsulated in a layer 71 for example of resin, which is then planarized, for example by chemical-mechanical planarizing, so as to free the upper end 51.2 of the pillar 51 and the upper end 20.2 of the photonic wire 20. The resin may be BCB (benzocyclobutene), inter alia.

In a following step (FIG. 7E), the holding arm 55 is produced by depositing a low-index layer, for example $Si_3N_4$ with a thickness of the order here of 250 nm, and lithography is used to define the bearing portion 55c, the spacer portion 55b and the holding portion 55a. The holding arm 55 is thus in contact with the pillar 51 at its bearing portion 55c, and in contact with the photonic wire 20 at its bearing portion 55a. The resin 71 is then eliminated so as to suspend the spacer portion 55b and holding portion 55a of the holding arm 55.

In a following step (FIG. 7F), the upper part 22 is suspended with respect to the lower part 21, by etching the portions 54 and 26 of the sacrificial layer 65, which is selective with respect to the holding arm 55 and the high-index crystalline material. The etching time is adjusted so as to completely eliminate the portion 26 present in the photonic wire 20, and so as not to completely eliminate the portion 54 present in the pillar 51.

What is thus obtained is a single-photon source 1 formed of a photonic wire 20 divided into two distinct and coaxial parts. The mechanical decoupling between these two parts makes it possible to substantially improve the indiscernibility factor I of the single-photon source 1, while the optical coupling between the two parts limits optical losses. The holding structure 50 holds the upper part 22 in a position suspended above the lower part 21.

Particular embodiments have just been described. Various modifications and variants will be apparent to a person skilled in the art.

The single-photon source 1 according to the first embodiment thus comprises holding arms 55 made from the high-index crystalline material, in this case GaAs. As a variant, it is possible to produce holding arms 55 from a material different from that of the high-index crystalline material of the photonic wire 20. Holding arms 55 identical or similar to the one described with reference to FIGS. 6A and 6B may thus be produced. These holding arms 55 may also be made from a metal material and form, at the upper end of the photonic wire 20, a crown extending only at the edge thereof, so as to leave free a greater surface area for the light extraction of the emitted photons. By way of example, the crown may have a width of 100 to 200 nm, and the thickness of the spacer portion of the holding arm 55 may have a width of around 200 to 500 nm and a length of the order of 5 to 20 μm. The metal layer may have a thickness of the order of around 100 to 500 nm. The production of such a holding arm 55 may be similar to the method described in the article by Böckler et al. entitled *Electrically driven high-Q quantum dot-micropillar cavities*, Appl. Phys. Lett. 92, 091107 (2008).

A description has been given above of some exemplary embodiments in which the emitter 23 emits single photons with a wavelength equal to around 950 nm. It is possible to adjust the features of the photonic wire 20 so as to emit photons in the wavelength of optical telecommunications, that is to say at around 1.3 μm and at around 1.55 μm.

As mentioned above, the single-photon source 1 may be tuned in terms of wavelength, for example by applying a mechanical stress within the support substrate 1o, which would then be a piezoelectric substrate, and such a mechanical stress would then be transmitted to the lower part 21 of the photonic wire 20.

It is also possible to tune the single-photon source 1 in terms of wavelength by applying a static electric field to the emitter 23 so as to modify the band gap energy of the quantum dot. By way of example, the substrate made of GaAs may be highly n-doped, and the upper part 22 made of GaAs is highly p-doped over the first 100 to 500 nm in the direction +Z. By using a holding arm 55 made of an electrically conductive material, and by applying a potential difference between the holding arm 55 and the support substrate 10, an electric field is generated that makes it possible to modify the properties of the quantum dot.

The invention claimed is:

1. A single-photon source, comprising:
   a support substrate comprising a reflective layer;
   a photonic wire,
     resting on the support substrate and arranged facing the reflective layer, and extending along a longitudinal axis Δ substantially orthogonal to the plane of the support substrate;
     comprising a single-photon emitter;
     forming a monomode waveguide for the single photons; and
     having transverse dimensions that vary longitudinally in the direction of an upper end of the photonic wire, so as to form a mode adapter for a guided optical mode;
   an optical excitation device designed to excite the emitter through a laser pulse, and thus bring about the spontaneous emission of single photons by the emitter;
   the photonic wire being formed of two coaxial parts that are distinct and spaced from one another along the longitudinal axis Δ:
     a lower part, resting in contact with the support substrate, in which the emitter is arranged,
     an upper part, suspended above the lower part and optically coupled thereto,
   the single-photon source furthermore comprising a holding structure, comprising:
     at least one pillar resting in contact with the support substrate and arranged adjacent to the photonic wire, and
     at least one holding arm mechanically connecting the upper part to the pillar and keeping the upper part suspended above the lower part.

2. The single-photon source according to claim 1, wherein the lower part has a volume less than that of the upper part.

3. The single-photon source according to claim 1, wherein the upper part comprises the mode adapter.

4. The single-photon source according to claim 1, wherein the upper part is spaced from the lower part by a distance $d_{sp}$ of between 5 nm and $\lambda_e/n$, where $\lambda_e$ is the wavelength of the photons emitted by the emitter and where n is the refractive index of the crystalline material of the photonic wire.

5. The single-photon source according to claim 1, wherein the photonic wire and the pillar are based on one and the same crystalline material.

6. The single-photon source according to claim 1, wherein the pillar comprises a spacer portion made of a sacrificial material, arranged between two parts of the pillar that are made from the crystalline material, this spacer portion being coplanar with the spacing between the lower and upper parts of the photonic wire.

7. The single-photon source according to claim 1, wherein the holding arm is made from said same crystalline material, and extends in a plane parallel to the plane of the support substrate from a lateral edge of the upper part.

8. The single-photon source according to claim 1, wherein the holding arm is made from a material different from said crystalline material, and extends over and in contact with an upper end, opposite the support substrate, of the photonic wire.

9. The single-photon source according to claim 1, wherein the photonic wire has a flared shape or a tapered shape in a direction opposite the support substrate.

10. The single-photon source according to claim 8, wherein the photonic wire has a tapered shape, and the holding arm has a holding portion partly in contact with the upper part, the holding portion having rotational symmetry about the longitudinal axis Δ and an average dimension in a plane parallel to the support substrate greater than a maximum value of the transverse dimensions of the photonic wire.

11. The single-photon source according to claim 1, wherein the photonic wire is based on a crystalline material chosen from among III-V compounds or II-VI compounds, and wherein the emitter is formed of at least one semiconductor quantum dot.

12. Method A method for manufacturing a single-photon source according to claim 1, comprising the following steps:
   producing a stack, comprising:
     a support substrate comprising a reflective layer covered with an etch stop dielectric layer;

a first and a second sub-layer, resting in contact with the dielectric layer, made from what is called a high-index crystalline material, between which an emitter is located, and intended to form the lower part;

a sacrificial layer resting in contact with the second sub-layer;

a second layer resting in contact with the sacrificial layer, and intended to form the upper part;

partially etching the stack so as to form the pillar and the photonic wire, a portion of the sacrificial layer then contributing to defining a lateral edge of the pillar, and a portion of the sacrificial layer then contributing to defining a lateral edge of the photonic wire;

selectively etching the sacrificial layer so as to eliminate the portion of the sacrificial layer of the photonic wire, and thus suspending the upper part above the lower part, while at the same time keeping at least part of the portion of the sacrificial layer of the pillar.

13. The manufacturing method according to claim 12, wherein the holding arm is produced in the step of forming the pillar and the photonic wire, and creates the mechanical connection between the pillar and the upper part of the photonic wire.

14. The manufacturing method according to claim 13, wherein, following the step of forming the pillar and the photonic wire, the upper part is not mechanically linked to the pillar, the method comprising the following steps:

depositing an encapsulation layer covering the pillar and the photonic wire, and planarizing the encapsulation layer so as to free an upper end of the pillar and an upper end of the photonic wire;

producing a holding arm extending over the encapsulation layer and in contact with the upper end of the pillar and the upper end of the photonic wire;

eliminating the encapsulation layer;

selectively etching the sacrificial layer, thus suspending the upper part above the lower part.

\* \* \* \* \*